(12) United States Patent
Yamade et al.

(10) Patent No.: US 8,796,681 B2
(45) Date of Patent: Aug. 5, 2014

(54) SEMICONDUCTOR DEVICE AND METHOD FOR MANUFACTURING THE SAME

(75) Inventors: Naoto Yamade, Isehara (JP); Junichi Koezuka, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/602,489

(22) Filed: Sep. 4, 2012

(65) Prior Publication Data

US 2013/0056727 A1   Mar. 7, 2013

(30) Foreign Application Priority Data

Sep. 7, 2011  (JP) ................................. 2011-195231

(51) Int. Cl.
*H01L 29/10* (2006.01)
*H01L 29/04* (2006.01)
*H01L 27/12* (2006.01)

(52) U.S. Cl.
CPC ................. *H01L 29/10* (2013.01); *H01L 29/04* (2013.01); *H01L 27/12* (2013.01)
USPC ................. 257/43; 257/64; 257/347

(58) Field of Classification Search
CPC .................... H01L 29/7869; H01L 21/02565; H01L 21/02554; H01L 21/02631
USPC ............................ 257/43, 88, 64, 347; 438/99
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,"Appl. Phys. Lett. (Applied Physics Letters) , Sep. 27, 2004, vol. 85 No. 13, pp. 2541-2543.

(Continued)

*Primary Examiner* — Long K Tran
*Assistant Examiner* — Dzung Tran
(74) *Attorney, Agent, or Firm* — Eric J. Robinson; Robinson Intellectual Property Law Office, P.C.

(57) ABSTRACT

A semiconductor device which is miniaturized and has sufficient electrical characteristics to function as a transistor is provided. In a semiconductor device including a transistor in which a semiconductor layer, a gate insulating layer, and a gate electrode layer are stacked in that order, an oxide semiconductor film which contains at least four kinds of elements of indium, gallium, zinc, and oxygen, and in which the percentage of the indium is twice or more as large as each of the percentage of the gallium and the percentage of the zinc when the composition of the four elements is expressed in atomic percentage is used as the semiconductor layer. In the semiconductor device, the oxide semiconductor film is a film to which oxygen is introduced in the manufacturing process and contains a large amount of oxygen, and an insulating layer including an aluminum oxide film is provided to cover the transistor.

14 Claims, 10 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,093,135 B2 | 1/2012 | Shimomura et al. |
| 8,207,025 B2 | 6/2012 | Suzawa et al. |
| 8,207,045 B2 | 6/2012 | Kakehata et al. |
| 8,237,166 B2 | 8/2012 | Kumomi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1* | 8/2007 | Hosono et al. ............ 257/347 |
| 2007/0252928 A1 | 11/2007 | Ito et al. |
| 2007/0267699 A1* | 11/2007 | Hoffman ............ 257/347 |
| 2007/0272922 A1 | 11/2007 | Kim et al. |
| 2007/0278490 A1* | 12/2007 | Hirao et al. ............ 257/64 |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0140609 A1* | 6/2010 | Yano et al. ............ 257/43 |
| 2010/0320459 A1* | 12/2010 | Umeda et al. ............ 257/43 |
| 2011/0049511 A1* | 3/2011 | Yano et al. ............ 257/43 |
| 2011/0168993 A1* | 7/2011 | Jeon et al. ............ 257/43 |
| 2011/0215317 A1 | 9/2011 | Yamazaki et al. |
| 2012/0034743 A1 | 2/2012 | Suzawa et al. |
| 2012/0074407 A1 | 3/2012 | Yamazaki et al. |
| 2012/0241734 A1 | 9/2012 | Honda et al. |
| 2013/0011961 A1 | 1/2013 | Ishizuka et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 | 6/2006 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

(56) References Cited

OTHER PUBLICATIONS

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashlr et al., "42.1: Invited Paper: Improved Amorphous In—Ga—Zn—0 TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun.17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Eng. Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08: SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Device Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,",AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposoium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,",AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

(56) References Cited

OTHER PUBLICATIONS

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H at al., "Polymer-Stabilized Liquid Crystal Blue Phases,", Nature Materials, Sep. 2, 2002, vol. 1, pp. 64-68.

Kimizuka.N. et al., "SPINEL,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clarks et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the semiconductor device.

In this specification, a semiconductor device generally means a device which can function by utilizing semiconductor characteristics, and an electrooptic device, a semiconductor circuit, and electronic equipment are all semiconductor devices.

2. Description of the Related Art

Attention has been focused on a technique for forming a transistor using a semiconductor thin film formed over a substrate having an insulating surface (also referred to as a thin film transistor (TFT)). The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor whose active layer includes an amorphous oxide including indium (In), gallium (Ga), and zinc (Zn) is disclosed (see Patent Document 1).

REFERENCE

Patent Document

[Patent Document 1] Japanese Published Patent Application No. 2006-165528

SUMMARY OF THE INVENTION

In order to achieve high-speed operation, low power consumption, high integration, or the like of a transistor, it is necessary to miniaturize a transistor.

However, degradation of electrical characteristics (typically, a short-channel effect) might become obvious with miniaturization of a transistor.

Accordingly, an object of one embodiment of the disclosed invention is to provide a miniaturized semiconductor device which has sufficient electrical characteristics to function as a transistor. Another object of one embodiment of the disclosed invention is to provide a manufacturing method of the above-described semiconductor device.

In a semiconductor device including a transistor in which a semiconductor layer, a gate insulating layer, and a gate electrode layer are stacked in that order, an oxide semiconductor film which contains at least four kinds of elements of indium, gallium, zinc, and oxygen, and in which the percentage of the indium is twice or more as large as each of the percentage of the gallium and the percentage of the zinc when the composition of the four elements is expressed in atomic percentage is used as the semiconductor layer. In the semiconductor device, the oxide semiconductor film is a film to which oxygen is introduced in the manufacturing process and contains a large amount of (excessive) oxygen, and an insulating layer including an aluminum oxide film is provided to cover the transistor.

The oxide semiconductor film is a non-single-crystal semiconductor, and can be formed with an oxide target having a composition of indium:gallium:zinc=3:1:2.

A surface of the oxide insulating layer over which the oxide semiconductor film is formed is planarized by polishing treatment (the average surface roughness is preferably less than or equal to 0.15 nm); therefore, the oxide semiconductor film that is a thin film can be provided thereover with good coverage.

Oxygen (which includes at least one of an oxygen radical, an oxygen atom, and an oxygen ion) may be introduced to the oxide semiconductor film to supply the oxygen to the oxide semiconductor film. Oxygen can be introduced by an ion implantation method, an ion doping method, a plasma immersion ion implantation method, plasma treatment, or the like.

Further, it is preferable that the oxide semiconductor film provided in the transistor includes a region where the oxygen content is higher than that in the stoichiometric composition of the oxide semiconductor in a crystalline state. In that case, the oxygen content is preferably larger than that in the stoichiometric composition of the oxide semiconductor. Alternatively, the oxygen content is higher than that of the oxide semiconductor in a single crystal state. In some cases, oxygen may exist between lattices of the oxide semiconductor.

Low-resistance regions whose resistances are lower than that of the channel formation region and which include a dopant are formed in the oxide semiconductor film so that the channel formation region is sandwiched between the low-resistance regions, by introducing the dopant into the oxide semiconductor film in a self-aligning manner with the use of the gate electrode layer as a mask. The dopant is an impurity which changes the electrical conductivity of the oxide semiconductor film. As the method for introducing the dopant, an ion implantation method, an ion doping method, a plasma immersion ion implantation method, or the like can be used.

With the oxide semiconductor film including the low-resistance regions between which the channel formation region is provided in the channel length direction, on-state characteristics (e.g., on-state current and field-effect mobility) of the transistor are increased, which enables high-speed operation and high-speed response of the transistor.

One embodiment of a structure of the present invention disclosed in this specification is a semiconductor device including an oxide semiconductor film including a channel formation region, which is provided over an oxide insulating layer; a gate insulating film over the oxide semiconductor film; a gate electrode layer overlapping with the oxide semiconductor film over the gate insulating film; and an insulating layer including an aluminum oxide film over the oxide semiconductor layer and the gate electrode layer. A surface of the oxide insulating layer has an average surface roughness of less than or equal to 0.15 nm. The oxide semiconductor film contains at least four kinds of elements of indium, gallium, zinc, and oxygen, and when the composition of the four elements is expressed in atomic percentage, the percentage of the indium is twice or more as large as each of the percentage of the gallium and the percentage of the zinc. A region of the oxide semiconductor film which does not overlap with the gate electrode layer contains a dopant.

The oxide semiconductor film is a non-single-crystal semiconductor, and may include a c-axis aligned crystal region.

In the oxide semiconductor film, the concentration of oxygen in a region which overlaps with neither the source electrode layer nor the drain electrode layer may be higher than that in a region which overlaps with either the source electrode layer or the drain electrode layer.

One embodiment of a structure of the present invention disclosed in this specification is a method for manufacturing a semiconductor device, including the steps of forming an oxide insulating layer, performing polishing treatment on a surface of the oxide insulating layer, forming an oxide semiconductor film over the oxide insulating layer subjected to the polishing treatment by a sputtering method using an oxide target having a composition of indium:gallium:zinc=3:1:2, implanting oxygen into the oxide semiconductor film, forming a gate insulating film over the oxide semiconductor film into which the oxygen is implanted, forming a gate electrode layer overlapping with the oxide semiconductor film over the gate insulating film, selectively introducing a dopant to the oxide semiconductor film using the gate electrode layer as a mask, and forming an insulating layer including an aluminum oxide film over the oxide semiconductor layer to which the dopant is introduced and the gate electrode layer.

One embodiment of a structure of the present invention disclosed in this specification is a method for manufacturing a semiconductor device, including the steps of forming an oxide insulating layer, performing polishing treatment on a surface of the oxide insulating layer, forming an oxide semiconductor film over the oxide insulating layer subjected to the polishing treatment by a sputtering method using an oxide target having a composition of indium:gallium:zinc=3:1:2, implanting oxygen into the oxide semiconductor film, processing the oxide semiconductor film into which the oxygen is implanted to be an island-shaped oxide semiconductor film, forming a gate insulating film over the island-shaped oxide semiconductor film, forming a gate electrode layer overlapping with the oxide semiconductor film over the gate insulating film, selectively introducing a dopant to the oxide semiconductor film using the gate electrode layer as a mask, and forming an insulating layer including an aluminum oxide film over the oxide semiconductor layer to which the dopant is introduced and the gate electrode layer.

In addition, heat treatment by which hydrogen or moisture is eliminated from the oxide semiconductor film (dehydration or dehydrogenation treatment) may be performed on the oxide semiconductor film. When a crystalline oxide semiconductor film is used as the oxide semiconductor film, heat treatment for crystallization may be performed.

One embodiment of the present invention relates to a semiconductor device including a transistor or a semiconductor device including a circuit which is formed by using a transistor. For example, one embodiment of the present invention relates to a semiconductor device including a transistor in which a channel formation region is formed using an oxide semiconductor or a semiconductor device including a circuit which is formed by using such a transistor. For example, one embodiment of the present invention relates to an electronic appliance which includes, as a component, a semiconductor integrated circuit including an LSI, a CPU, a power device mounted in a power circuit, a memory, a thyristor, a converter, an image sensor, or the like, or a light-emitting display device including a light-emitting element or an electro-optical device typified by a liquid crystal display panel.

A semiconductor device which is miniaturized and has sufficient electrical characteristics to function as a transistor and a method for manufacturing the semiconductor device can be provided.

DETAILED DESCRIPTION OF THE INVENTION

Figure 1A:
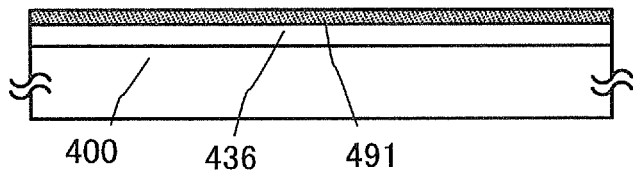
FIGS. 1A to 1E illustrate one embodiment of a semiconductor device and a method for manufacturing the semiconductor device.
Figure 1B:
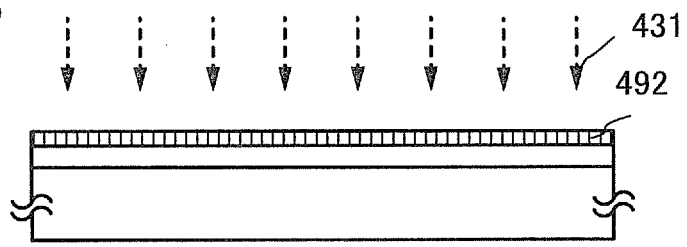

Hereinafter, embodiments of the invention disclosed in this specification will be described with reference to the accompanying drawings. Note that the invention disclosed in this specification is not limited to the following description, and it is easily understood by those skilled in the art that modes and details can be variously changed without departing from the spirit and the scope of the invention. Therefore, the invention disclosed in this specification is not construed as being limited to the description of the following embodiments. Note that the ordinal numbers such as "first" and "second" in this specification are used for convenience and do not denote the order of steps and the stacking order of layers. In addition, the ordinal numbers in this specification do not denote particular names which specify the present invention.

Embodiment 1

In this embodiment, one embodiment of a semiconductor device and a method for manufacturing the semiconductor device will be described with reference to FIGS. 1A to 1E. In this embodiment, a transistor including an oxide semiconductor film is described as an example of the semiconductor device.

The transistor may have a single-gate structure in which one channel formation region is formed, a double-gate structure in which two channel formation regions are formed, or a triple-gate structure in which three channel formation regions are formed. Alternatively, the transistor may have a dual-gate structure including two gate electrode layers positioned over and under a channel formation region with a gate insulating film provided therebetween.

A transistor 440 illustrated in FIGS. 1A to 1E which also illustrate its manufacturing method is an example of a planar-type transistor having a top-gate structure.

The transistor 440 includes, over a substrate 400 having an insulating surface over which an oxide insulating layer 436 is provided, an oxide semiconductor film 403 including a channel formation region 409 and low-resistance regions 404a and 404b, a gate insulating film 402, and a gate electrode layer 401. Insulating layers 407a and 407b are formed over the transistor 440. Wiring layers 465a and 465b which are electrically connected to the oxide semiconductor film 403 and serve as a source electrode layer and a drain electrode layer are provided.

The oxide semiconductor film 403 is an oxide semiconductor film which contains at least four kinds of elements of indium, gallium, zinc, and oxygen and in which the percentage of the indium is twice or more as large as each of the percentage of the gallium and the percentage of the zinc when the composition of the four elements is expressed in atomic percentage (such an oxide semiconductor film is also referred to as an IGZO layer).

The oxide semiconductor film 403 can be formed by a sputtering method with an oxide target having a composition of indium:gallium:zinc=3:1:2.

In the semiconductor device, the oxide semiconductor film 403 is a film to which oxygen is introduced in the manufacturing process and which contains a large amount of (excessive) oxygen. The insulating layers covering the transistor 440 are insulating layers including an aluminum oxide film. In this embodiment, an aluminum oxide film is used as the insulating layer 407a, and a silicon oxynitride film is used as the insulating layer 407b. When the density of the aluminum oxide film is set to high (the film density is higher than or equal to 3.2 g/cm$^3$, preferably higher than or equal to 3.6 g/cm$^3$), the transistor 440 can have stable electrical characteristics. The film density can be measured by Rutherford backscattering spectrometry (RBS) or X-lay reflection (XRR).

A surface of the oxide insulating layer 436 over which the oxide semiconductor film 403 is formed is planarized by polishing treatment (the average surface roughness is preferably less than or equal to 0.15 nm); therefore, the oxide semiconductor film 403 that is a thin film can be provided thereover with good coverage.

Oxygen (including at least any one of an oxygen radical, an oxygen atom, and an oxygen ion) may be introduced into the oxide semiconductor film 403 in order to supply oxygen to the film. Oxygen can be introduced by an ion implantation method, an ion doping method, a plasma immersion ion implantation method, plasma treatment, or the like.

It is preferable that the oxide semiconductor film 403 in the transistor 440 includes a region where the oxygen content is higher than that in the stoichiometric composition of the oxide semiconductor in a crystalline state. In that case, the oxygen content is preferably larger than that in the stoichiometric composition of the oxide semiconductor. Alternatively, the oxygen content is higher than that of the oxide semiconductor in a single crystal state. In some cases, oxygen may exist between lattices of the oxide semiconductor.

The low-resistance regions 404a and 404b whose resistances are lower than that of the channel formation region 409 and which include a dopant are formed in the oxide semiconductor film 403 so that the channel formation region 409 is sandwiched between the low-resistance regions, by introducing the dopant into the oxide semiconductor film 403 in a self-aligning manner with the use of the gate electrode layer 401 as a mask. The dopant is an impurity which changes the conductivity of the oxide semiconductor film 403. As the method for introducing the dopant, an ion implantation method, an ion doping method, a plasma immersion ion implantation method, or the like can be used.

The oxide semiconductor film 403 including the low-resistance regions 404a and 404b between which the channel formation region 409 is provided lies in the channel length direction, whereby on-state characteristics (e.g., on-state current and field-effect mobility) of the transistor 440 are increased, which enables high-speed operation and high-speed response of the transistor 440.

The oxide semiconductor is non-single-crystal and may be either amorphous or polycrystalline. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured using the oxide semiconductor, interface scattering can be reduced, and relatively high mobility can be obtained with relative ease.

In an oxide semiconductor having crystallinity, defects in the bulk can be further reduced and when a surface flatness is improved, mobility higher than that of an oxide semiconductor layer in an amorphous state can be obtained. In order to improve the surface flatness, the oxide semiconductor is preferably formed over a flat surface. Specifically, the oxide semiconductor is formed over a surface with the average surface roughness (Ra) of less than or equal to 0.15 nm, preferably less than or equal to 0.1 nm.

$R_a$ is obtained by expanding, into three dimensions, arithmetic mean surface roughness that is defined by JIS B 0601: 2001 (ISO4287:1997) so as to be able to apply it to a curved surface. $R_a$ can be expressed as an "average value of the absolute values of deviations from a reference surface to a designated surface" and is defined by the following formula.

$$Ra = \frac{1}{S_0} \int_{y_1}^{y_2} \int_{x_1}^{x_2} |f(x, y) - Z_0| dx\, dy \qquad \text{[Formula 1]}$$

Here, the designated surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. $S_0$ represents the area of a rectangle which is obtained by projecting the designated surface on the xy plane, and $Z_0$ represents the height of the reference surface (the average height of the designated surface). Ra can be measured using an atomic force microscope (AFM).

As the oxide semiconductor film 403, an oxide semiconductor film including a crystal and having crystallinity (crystalline oxide semiconductor film) can be used. The crystals in the crystalline oxide semiconductor film may have crystal axes oriented in random directions or in a certain direction.

For example, an oxide semiconductor film including a crystal having a c-axis which is substantially perpendicular to a surface of the oxide semiconductor film can be used as the crystalline oxide semiconductor film.

The oxide semiconductor film including a crystal having a c-axis substantially perpendicular to a surface of the oxide semiconductor film has neither a single crystal structure nor an amorphous structure and is an oxide semiconductor having a c-axis alignment (also referred to as a c-axis aligned crystalline oxide semiconductor: CAAC-OS) film. Note that the crystalline oxide semiconductor film may partly include a grain boundary.

CAAC is a c-axis aligned crystal which has a triangular or hexagonal atomic arrangement when seen from the direction perpendicular to an a-b plane, a surface, or an interface and in which layers including metal atoms and oxygen atoms are stacked in a layered manner (note that the normal vectors of the layers are parallel to the c-axis direction), and the direction of the a-axis or the b-axis is varied in the a-b plane (or the surface or the interface), that is, which rotates around the c-axis. A thin film including CAAC is crystallized along the c-axis but alignment along the a-b planes does not necessarily appear.

The CAAC is, in a broad sense, non-single-crystal including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

A thin film including CAAC is not a single crystal, but this does not mean that the CAAC film is composed of only an amorphous component. Although the film including CAAC includes a crystal portion, a boundary between one crystal portion and another crystal portion is not clear in some cases.

Nitrogen may be substituted for part of oxygen included in the CAAC. The c-axes of individual crystal portions included in the thin film including CAAC may be aligned in one direction (e.g., the direction perpendicular to a surface of a substrate over which the CAAC is formed, a surface of the CAAC, or an interface of the CAAC). Alternatively, normals of the a-b planes of individual crystal portions included in the CAAC may be aligned in one direction (e.g., the direction perpendicular to a surface of a substrate over which the CAAC is formed, a surface of the CAAC, an interface of the CAAC, or the like).

The crystalline oxide semiconductor film enables a change in the electrical characteristics of the transistor due to irradiation with visible light or ultraviolet light to be further suppressed, so that a highly reliable semiconductor device can be provided.

There are three methods for obtaining a crystalline oxide semiconductor film having c-axis alignment. The first is a method in which an oxide semiconductor film is deposited at a temperature(s) higher than or equal to 200° C. and lower than or equal to 500° C. such that the c-axis is substantially perpendicular to the top surface. The second is a method in which an oxide semiconductor film is deposited thin, and is subjected to heat treatment at a temperature(s) higher than or equal to 200° C. and lower than or equal to 700° C., so that the c-axis is substantially perpendicular to the top surface. The third is a method in which a first-layer oxide semiconductor film is deposited thin, and is subjected to heat treatment at a temperature(s) higher than or equal to 200° C. and lower than or equal to 700° C., and a second-layer oxide semiconductor film is deposited thereover, so that the c-axis is substantially perpendicular to the top surface.

The oxide semiconductor film 403 has a thickness greater than or equal to 1 nm and less than or equal to 30 nm (preferably greater than or equal to 5 nm and less than or equal to 10 nm) and can be formed by a sputtering method, a molecular beam epitaxy (MBE) method, a CVD method, a pulse laser deposition method, an atomic layer deposition (ALD) method, or the like as appropriate. The oxide semiconductor film 403 may be formed with a sputtering apparatus which performs deposition in the state where top surfaces of a plurality of substrates are substantially perpendicular to a top surface of a sputtering target.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is lower than or equal to −80° C., preferably lower than or equal to −100° C. is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas is increased and the power is optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

FIGS. 1A to 1E illustrate an example of a method for manufacturing the transistor 440.

First, the oxide insulating layer 436 is formed over the substrate 400 having an insulating surface.

There is no particular limitation on a substrate that can be used as the substrate 400 having an insulating surface as long as it has heat resistance enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400, or the substrate provided with a semiconductor element can be used as the substrate 400.

The semiconductor device may be manufactured using a flexible substrate as the substrate 400. To manufacture a flexible semiconductor device, the transistor 440 including the oxide semiconductor film 403 may be directly formed over a flexible substrate; or alternatively, the transistor 440 including the oxide semiconductor film 403 may be formed over a substrate, and then may be separated and transferred to a flexible substrate. Note that, in order to separate the transistor from the formation substrate and transfer it to the flexible substrate, a separation layer may be provided between the formation substrate and the transistor 440 including an oxide semiconductor film.

The oxide insulating layer 436 can be formed by a plasma CVD method, a sputtering method, or the like using any of silicon oxide, silicon oxynitride, aluminum oxide, aluminum oxynitride, hafnium oxide, and gallium oxide, or a mixed material thereof.

The oxide insulating layer 436 may be either a single layer or a stacked layer. For example, a silicon oxide film, an In—Hf—Zn-based oxide film, and the oxide semiconductor film 403 may be stacked in that order over the substrate 400; a silicon oxide film, an In—Zr—Zn-based oxide film with an atomic ratio of In:Zr:Zn=1:1:1, and the oxide semiconductor film 403 may be stacked in that order over the substrate 400; or a silicon oxide film, an In—Gd—Zn-based oxide film with an atomic ratio of In:Gd:Zn=1:1:1, and the oxide semiconductor film 403 may be stacked in that order over the substrate 400.

A silicon oxide film is formed by a sputtering method as the oxide insulating layer 436 in this embodiment.

Further, a nitride insulating film may be provided between the oxide insulating layer 436 and the substrate 400. The nitride insulating film can be formed by a plasma CVD method, a sputtering method, or the like with the use of silicon nitride, silicon nitride oxide, aluminum nitride, or aluminum nitride oxide, or a mixed material of any of these materials.

Next, an oxide semiconductor film 491 is formed over the oxide insulating layer 436 (see FIG. 1A).

The oxide insulating layer 436, which is in contact with the oxide semiconductor film 491, preferably contains a large amount of oxygen which exceeds at least the amount of oxygen in the stoichiometric composition in the film (bulk). For example, in the case where a silicon oxide film is used as the oxide insulating layer 436, the composition formula is $SiO_{2+\alpha}$ ($\alpha>0$). With such an oxide insulating layer 436, oxygen can be supplied to the oxide semiconductor film 491, leading to favorable characteristics. By supply of oxygen to the oxide semiconductor film 491, oxygen vacancies in the film can be repaired.

For example, when the oxide insulating layer 436 containing much (excessive) oxygen, which serves as an oxygen supply source, is provided so as to be in contact with the oxide semiconductor film 491, oxygen can be supplied from the oxide insulating layer 436 to the oxide semiconductor film 491. Heat treatment may be performed in the state where the oxide semiconductor film 491 and the oxide insulating layer 436 are in contact with each other at least partly to supply oxygen to the oxide semiconductor film 491.

In order that hydrogen or water will be not contained in the oxide semiconductor film 491 as much as possible in the formation step of the oxide semiconductor film 491, it is preferable to heat the substrate provided with the oxide insulating layer 436 in a preheating chamber in a sputtering apparatus as a pretreatment for formation of the oxide semiconductor film 491 so that impurities such as hydrogen and moisture adsorbed to the substrate and/or the oxide insulating layer 436 are eliminated and evacuated. As an exhaustion unit provided in the preheating chamber, a cryopump is preferable.

Planarizing treatment is performed on the region of the oxide insulating layer 436 which is to be in contact with the oxide semiconductor film 491. The planarization treatment may be, but not particularly limited to, polishing treatment (such as chemical mechanical polishing (CMP)), dry etching treatment, or plasma treatment. In this embodiment, the average surface roughness of the surface of the oxide insulating layer 436 becomes less than or equal to 0.15 nm by the planarization treatment.

As plasma treatment, reverse sputtering in which an argon gas is introduced and plasma is generated can be performed. The reverse sputtering is a method in which voltage is applied to a substrate side with use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the top surface of the oxide insulating layer 436.

As the planarization treatment, polishing treatment, dry etching treatment, or plasma treatment may be performed plural times, or these treatments may be performed in combination. In the case where the treatments are combined, the order of steps is not particularly limited and may be set as appropriate depending on the roughness of the surface of the oxide insulating layer 436.

Note that it is preferable that the oxide semiconductor film 491 is formed under a condition that much oxygen is contained therein during deposition (e.g., deposited by a sputtering method in a 100% oxygen atmosphere), so as to be a film containing much oxygen (preferably having a region containing a large amount of oxygen which exceeds that in the stoichiometric composition of the oxide semiconductor in a crystalline state).

Note that in this embodiment, a target used for forming the oxide semiconductor film 491 by a sputtering method is, for example, an oxide target having a composition of In:Ga:Zn=3:1:2 [atomic percentage], so that an In—Ga—Zn-based oxide film (IGZO film) is formed.

The relative density (the fill rate) of the metal oxide target is greater than or equal to 90% and less than or equal to 100%, preferably greater than or equal to 95% and less than or equal to 99.9%. By using the metal oxide target with high relative density, a dense oxide semiconductor film can be formed.

It is preferable that a high-purity gas from which an impurity such as hydrogen, water, a hydroxyl group, or hydride is removed be used as a sputtering gas for the deposition of the oxide semiconductor film 491.

The substrate is held in a deposition chamber kept under reduced pressure. Then, residual moisture in the deposition chamber is removed, a sputtering gas from which hydrogen and moisture are removed is introduced, and the oxide semiconductor film 491 is formed over the oxide insulating layer 436 using the above-described target. In order to remove moisture remaining in the deposition chamber, an entrapment vacuum pump such as a cryopump, an ion pump, or a titanium sublimation pump is preferably used. As an exhaustion unit, a turbo molecular pump to which a cold trap is added may be used. From the deposition chamber evacuated with a cryopump, a hydrogen atom, a compound including a hydrogen atom such as water ($H_2O$) (preferably, also a compound including a carbon atom), or the like, for example, is removed; thus, the concentration of an impurity in the oxide semiconductor film 491 formed in the deposition chamber can be reduced.

The oxide insulating layer 436 and the oxide semiconductor film 491 are preferably formed in succession without exposure to the air. When oxide insulating layer 436 and the oxide semiconductor film 491 are formed in succession without exposure to the air, impurities such as hydrogen and moisture can be prevented from being adsorbed onto a surface of the oxide insulating layer 436.

Next, oxygen 431 (including at least one of an oxygen radical, an oxygen atom, and an oxygen ion) is introduced to the oxide semiconductor film 491; thus, oxygen is supplied to the oxide semiconductor film 491. Oxygen can be introduced by an ion implantation method, an ion doping method, a plasma immersion ion implantation method, plasma treatment, or the like.

The step of introducing oxygen in the manufacturing process of the transistor 440 in this embodiment is preferably performed after formation of the oxide semiconductor film 491 before formation of the gate electrode layer 401. The step of introducing oxygen to the oxide semiconductor film 403 may be performed plural times.

In the step of introducing oxygen, oxygen may be directly introduced to the oxide semiconductor film or introduced to the oxide semiconductor film through another film such as the gate insulating film or an insulating film. An ion implantation method, an ion doping method, a plasma immersion ion implantation method, or the like may be employed in the case where oxygen is introduced to the oxide semiconductor film through another film, whereas plasma treatment or the like can also be employed in the case where oxygen is directly introduced to the oxide semiconductor film 491 in an exposed state as in this embodiment.

In this embodiment, the oxygen 431 is implanted to the oxide semiconductor film 491 by an ion implantation method. By the implantation of the oxygen 431, the oxide semiconductor film 491 is changed into an oxide semiconductor film 492 having a region where the oxygen content is higher than that in the stoichiometric composition of the oxide semiconductor in a crystalline state (see FIG. 1B).

For example, it is preferable that the concentration of oxygen in the oxide semiconductor film 492 which is obtained by the introduction of the oxygen 431, is greater than or equal to $1 \times 10^{18}/cm^3$ and less than or equal to $3 \times 10^{21}/cm^3$. Such an oxygen-excessive region may exist in part of the oxide semiconductor film 492 (including its interface). Therefore, by the introduction of the oxygen 431, oxygen is contained in at least one of the following portions in the stack of the gate insulating film 402, the oxide semiconductor film 492, and an insulating layer 436: an interface between the oxide insulating layer 436 and the oxide semiconductor film 492; the oxide semiconductor film 492; and an interface between the oxide semiconductor film 492 and the gate insulating film 402.

The oxide semiconductor film 492 includes a region where the oxygen content is higher than that in the stoichiometric composition of an oxide semiconductor in a crystalline state. In that case, the oxygen content is preferably larger than that in the stoichiometric composition of the oxide semiconductor film. Alternatively, the oxygen content is larger than that of the oxide semiconductor in a single crystal state. In some cases, oxygen may exist between lattices of the oxide semiconductor. The composition of such an oxide semiconductor can be expressed by $InGaZn_mO_{m+3x}$ (x>1). For example, supposing that m=1, the value of 1+3x in $InGaZnO_{1+3x}$ (x>1) exceeds 4 in the case where the content of oxygen is excess.

Oxygen vacancies in the oxide semiconductor film 492 can be repaired by the oxygen 431.

In the oxide semiconductor, oxygen is one of main component materials. Thus, it is difficult to accurately estimate the oxygen concentration of the oxide semiconductor film by a method such as secondary ion mass spectrometry (SIMS). In other words, it can be said that it is hard to determine whether oxygen is intentionally added to the oxide semiconductor film.

Incidentally, it is known that oxygen contains isotopes such as $^{17}O$ and $^{18}O$ and the proportions of $^{17}O$ and $^{18}O$ in all of the oxygen atoms in nature is about 0.037% and about 0.204%, respectively. That is to say, it is possible to measure the concentrations of these isotopes in the oxide semiconductor film by a method such as SIMS; therefore, the oxygen concentration of the oxide semiconductor film may be able to be estimated more accurately by measuring the concentrations of these isotopes. Thus, the concentration of the isotope may be measured to determine whether oxygen is intentionally added to the oxide semiconductor film.

A film containing much oxygen is not necessarily used as the insulating film (such as the oxide insulating layer 436 or the insulating film 402) which is in contact with the oxide semiconductor film 492 in the case where the oxygen 431 is directly introduced to the oxide semiconductor film 492 as in this embodiment. Such a film containing much oxygen may be used as the insulating film (such as the oxide insulating layer 436 or the insulating film 402) which is in contact with the oxide semiconductor film 492 and the oxygen 431 may be directly introduced to the oxide semiconductor film 492; in this manner, a plurality of oxygen supply methods can be performed.

Next, the film-shaped oxide semiconductor film 492 is processed into the island-shaped oxide semiconductor film 403 by a photolithography step.

A resist mask for forming the island-shaped oxide semiconductor film 403 may be formed by an inkjet method. Formation of the resist mask by an inkjet method needs no photomask; thus, manufacturing cost can be reduced.

Note that as the etching of the oxide semiconductor film 492, dry etching, wet etching, or both of the dry etching and wet etching may be employed. As an etchant used for wet etching of the oxide semiconductor film 492, for example, a mixed solution of phosphoric acid, acetic acid, and nitric acid, or the like can be used. Alternatively, ITO-07N (produced by KANTO CHEMICAL CO., INC.) may be used.

Further, heat treatment may be performed on the oxide semiconductor film 403 in order to remove excess hydrogen (including water and a hydroxyl group) (to perform dehydration or dehydrogenation treatment). The temperature of the heat treatment is higher than or equal to 300° C. and lower than or equal to 700° C., or lower than the strain point of the substrate. The heat treatment can be performed under reduced pressure, a nitrogen atmosphere, or the like. For example, the substrate is put in an electric furnace which is one of heat treatment apparatuses, and the oxide semiconductor film 403 is subjected to heat treatment at 450° C. for one hour in a nitrogen atmosphere.

Further, the heat treatment apparatus used is not limited to an electric furnace, and an apparatus for heating a processing object by heat conduction or heat radiation from a heating element such as a resistance heating element may be alternatively used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the heat treatment, GRTA may be performed as follows. The substrate is put in an inert gas heated at high temperature of 650° C. to 700° C., is heated for several minutes, and is taken out of the inert gas.

Note that in heat treatment, it is preferable that moisture, hydrogen, and the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, further preferably 7N (99.99999%) or higher (that is, the impurity concentration is preferably 1 ppm or lower, further preferably 0.1 ppm or lower).

In addition, after the oxide semiconductor film 403 is heated by the heat treatment, a high-purity oxygen gas, a high-purity $N_2O$ gas, or ultra dry air (the moisture amount is less than or equal to 20 ppm (−55° C. by conversion into a dew point), preferably less than or equal to 1 ppm, further preferably less than or equal to 10 ppb according to the measurement with a dew point meter of a cavity ring down laser spectroscopy (CRDS) system) may be introduced into the same furnace. It is preferable that water, hydrogen, or the like is not contained in the oxygen gas or the dinitrogen monoxide gas. Alternatively, the purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or lower, further preferably 0.1 ppm or lower). The oxygen gas or the $N_2O$ gas acts to supply oxygen that is a main constituent material of the oxide semiconductor and that is reduced by the step for removing an impurity for dehydration or dehydrogenation, so that the oxide semiconductor film 403 can be a high-purified, electrically i-type (intrinsic) oxide semiconductor film.

Note that the heat treatment for dehydration or dehydrogenation may be performed after the formation of the oxide semiconductor film 491 in film shape or after the formation of the island-shaped oxide semiconductor film 403.

The heat treatment for dehydration or dehydrogenation may be performed plural times and may be combined with another heat treatment.

When the heat treatment for dehydration or dehydrogenation is performed in the state where the oxide insulating layer 436 is covered with the film-shaped oxide semiconductor film which has not been processed into the island-shaped oxide semiconductor film 403, oxygen contained in the oxide insulating layer 436 can be prevented from being released by the heat treatment, which is preferable.

The dehydration or dehydrogenation treatment may accompany elimination of oxygen which is a main constituent material of an oxide semiconductor to lead to a reduction in oxygen. An oxygen vacancy exists in a portion where oxygen is eliminated in an oxide semiconductor film, and a donor level which leads to a change in the electrical characteristics of a transistor is formed owing to the oxygen vacancy.

Thus, oxygen is preferably supplied to the oxide semiconductor film in the case where the dehydration or dehydrogenation treatment is performed. By supply of oxygen to the oxide semiconductor film, oxygen vacancies in the film can be repaired.

Therefore, the dehydration or dehydrogenation treatment is preferably performed before oxygen is introduced to the oxide semiconductor film 491.

An oxide insulating film including a large amount of (excessive) oxygen, which serves as a supply source of oxygen, may be provided so as to be in contact with the oxide semiconductor film, whereby oxygen can be supplied from the oxide insulating film to the oxide semiconductor film. In the above structure, heat treatment may be performed in the state where the oxide semiconductor film, which has been subjected to the heat treatment for dehydration or dehydrogenation, and the oxide insulating film are at least partly in contact with each other to supply oxygen to the oxide semiconductor film By removing hydrogen or moisture from the oxide semiconductor to highly purify the oxide semiconductor so as not to contain impurities as much as possible, and supplying oxygen to repair oxygen vacancies therein, the oxide semiconductor can be turned into an i-type (intrinsic) oxide semiconductor or a substantially i-type (intrinsic) oxide semiconductor. This enables the Fermi level ($E_f$) of the oxide semiconductor to be at the same level as the intrinsic Fermi level ($E_i$) thereof. Accordingly, by using the oxide semiconductor film for a transistor, fluctuation in the threshold voltage Vth of the transistor due to an oxygen vacancy and a shift of the threshold voltage ΔVth can be reduced.

Although not illustrated in this embodiment, a source electrode layer and a drain electrode layer (including a wiring formed using the same layer) may be formed over the oxide semiconductor film 403. A conductive film used for the source electrode layer and the drain electrode layer is formed using a material that can withstand heat treatment performed later; for example, a metal film containing an element selected from Al, Cr, Cu, Ta, Ti, Mo, and W, or a metal nitride film containing any of the above elements as a component (a titanium nitride film, a molybdenum nitride film, or a tungsten nitride film) can be used. A metal film having a high melting point such as Ti, Mo, W, or the like or a metal nitride film of any of these elements (a titanium nitride film, a molybdenum nitride film, and a tungsten nitride film) may be stacked on one of or both of a lower side and an upper side of a metal film of Al, Cu, or the like. Alternatively, the conductive film used for the source electrode layer and the drain electrode layer may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials which contains silicon oxide can be used.

A resist mask is formed over the conductive film by a photolithography step. Then, Selective etching is performed, so that the source electrode layer and the drain electrode layer are formed. After that, the resist mask is removed.

Next, the gate insulating film 402 covering the oxide semiconductor film 403 is formed.

Note that a surface of the oxide semiconductor film 403 may also be subjected to the planarization treatment in order to improve the coverage with the gate insulating film 402. The surface of the oxide semiconductor film 403 is preferably flat particularly in the case where a thin insulating film is used as the gate insulating film 402.

The gate insulating film 402 can be formed to have a thickness greater than or equal to 1 nm and less than or equal to 20 nm by a sputtering method, an MBE method, a CVD method, a pulse laser deposition method, an ALD method, or the like as appropriate. The gate insulating film 402 may be formed with a sputtering apparatus which performs deposition on surfaces of a plurality of substrates set substantially perpendicular to a surface of a sputtering target.

The gate insulating film 402 can be formed using a silicon oxide film, a gallium oxide film, an aluminum oxide film, a silicon nitride film, a silicon oxynitride film, an aluminum oxynitride film, or a silicon nitride oxide film. It is preferable that a portion of the gate insulating film 402 which is in contact with the oxide semiconductor film 403 contains oxygen. In particular, the gate insulating film 402 preferably contains a large amount of oxygen which exceeds at least the amount of oxygen in the stoichiometric composition in the film (bulk). For example, in the case where a silicon oxide film is used as the gate insulating film 402, the composition formula is $SiO_{2+\alpha}$ ($\alpha>0$). In this embodiment, a silicon oxide film of $SiO_{2+\alpha}$ ($\alpha>0$) is used as the gate insulating film 402. The use of the silicon oxide film as the gate insulating film 402 makes it possible to supply oxygen to the oxide semiconductor film 403, which leads to good characteristics. Further, the gate insulating film 402 is preferably formed in consideration of the size of a transistor to be formed and the step coverage with the gate insulating film 402.

The gate insulating film 402 can be formed using a high-k material such as hafnium oxide, yttrium oxide, hafnium silicate ($HfSi_xO_y$ (x>0, y>0)), hafnium silicate to which nitrogen is added ($HfSiO_xN_y$ (x>0, y>0)), hafnium aluminate ($HfAl_xO_y$ (x>0, y>0)), or lanthanum oxide, whereby gate leakage current can be reduced. Further, the gate insulating film 402 may have either a single-layer structure or a stacked-layer structure.

Figure 1C:
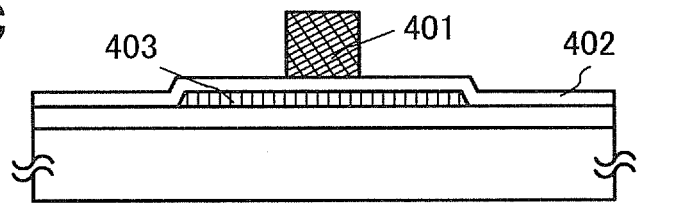

Then, the gate electrode layer 401 is formed over the gate insulating film 402 by a plasma CVD method, a sputtering method, or the like (see FIG. 1C). The gate electrode layer 401 can be formed using a metal material such as molybdenum, titanium, tantalum, tungsten, aluminum, copper, chromium, neodymium, or scandium or an alloy material which contains any of these materials as its main component. A semiconductor film which is doped with an impurity element such as phosphorus and is typified by a polycrystalline silicon film, or a silicide film of nickel silicide or the like can also be used as the gate electrode layer 401. The gate electrode layer 401 has either a single-layer structure or a stacked-layer structure.

The gate electrode layer 401 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the gate electrode layer 401 has a stacked structure of the above conductive material and the above metal material.

As one layer of the gate electrode layer 401 which is in contact with the gate insulating film 402, a metal oxide film containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function of 5 eV or higher, preferably 5.5 eV or higher, which enables the threshold voltage of the transistor to take a positive value when used as the gate electrode layer, so that a switching element of so-called normally-off type can be achieved.

Next, a dopant 421 is introduced to the oxide semiconductor film 403 using the gate electrode layer 401 as a mask, whereby the low-resistance regions 404a and 404b are formed.

The dopant 421 is an impurity by which the electrical conductivity of the oxide semiconductor film 403 is changed. One or more selected from the following can be used as the dopant 421: Group 15 elements (typical examples thereof are phosphorus (P), arsenic (As), and antimony (Sb)), boron (B), aluminum (Al), nitrogen (N), argon (Ar), helium (He), neon (Ne), indium (In), fluorine (F), chlorine (Cl), titanium (Ti), and zinc (Zn).

Alternatively, the dopant 421 can be introduced to the oxide semiconductor film 403 through another film (e.g., the gate insulating film 402) by an implantation method. As the method for introducing the dopant 421, an ion implantation method, an ion doping method, a plasma immersion ion implantation method, or the like can be used. In that case, it is preferable to use a single ion of the dopant 421, or a fluoride ion or chloride ion thereof.

The introduction of the dopant 421 may be controlled by setting the implantation conditions such as the acceleration voltage and the dosage, or the thickness of the film through which the dopant passes as appropriate. In this embodiment, phosphorus is used as the dopant 421, whose ion is implanted by an ion implantation method. Note that the dosage of the dopant 421 may be greater than or equal to $1\times10^{13}$ ions/cm$^2$ and less than or equal to $5\times10^{16}$ ions/cm$^2$.

The concentration of the dopant 421 in the low-resistance regions is preferably greater than or equal to $5\times10^{18}$/cm$^3$ and less than or equal to $1\times10^{22}$/cm$^3$.

The dopant 421 may be introduced while the substrate 400 is heated.

The introduction of the dopant 421 into the oxide semiconductor film 403 may be performed plural times, and plural kinds of dopant may be used.

Further, heat treatment may be performed after the introduction of the dopant 421. The heat treatment is preferably performed at a temperature higher than or equal to 300° C. and lower than or equal to 700° C., further preferably higher than or equal to 300° C. and lower than or equal to 450° C., for one hour under an oxygen atmosphere. The heat treatment may be performed under a nitrogen atmosphere, reduced pressure, or the air (ultra-dry air).

In the case where the oxide semiconductor film 403 is a crystalline oxide semiconductor film, the oxide semiconductor film 403 may be partly made amorphous by the introduction of the dopant 421. In that case, the crystallinity of the oxide semiconductor film 403 can be recovered by performing heat treatment thereon after the introduction of the dopant 421.

Thus, the oxide semiconductor film 403 in which the low-resistance regions 404a and 404b are formed with the channel formation region 409 provided therebetween is formed.

Figure 1D:
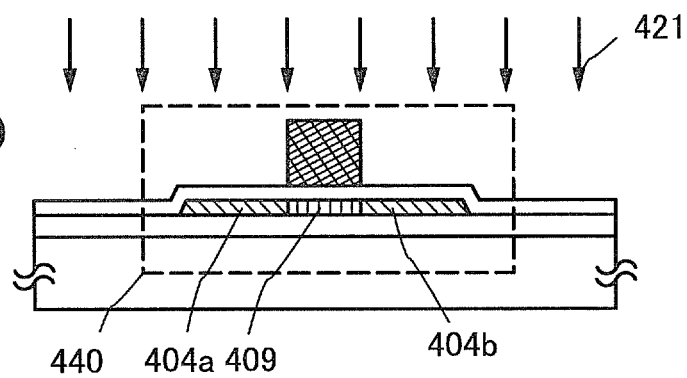
Figure 1E:
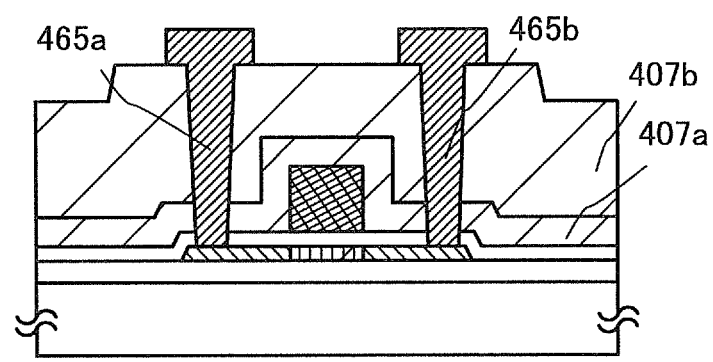

Through the above-described process, the transistor 440 of this embodiment can be manufactured (see FIG. 1D). An IGZO film which contains at least four kinds of elements of indium, gallium, zinc, and oxygen, in which the percentage of indium is twice or more as large as each of the percentage of gallium and the percentage of zinc when the composition of the four elements is expressed in atomic percentage, and to which a large amount of (excessive) oxygen is introduced is used as the oxide semiconductor film 403, whereby the transistor 440 can have good on-state characteristics (high field-effect mobility), small off-state current, and high reliability.

Next, the insulating layers 407a and 407b are formed over the oxide semiconductor film 403, the gate insulating film 402, and the gate electrode layer 401.

The insulating layers 407a and 407b each may be a single layer or a stack of layers, and include at least an aluminum oxide film.

The insulating layers 407a and 407b can be formed by a plasma CVD method, a sputtering method, an evaporation method, or the like.

Typical examples of the insulating layers 407a and 407b include an inorganic insulating film such as a silicon oxide film, a silicon oxynitride film, an aluminum oxynitride film, and a gallium oxide film in addition to an aluminum oxide film. Furthermore, a hafnium oxide film, a magnesium oxide film, a zirconium oxide film, a lanthanum oxide film, a barium oxide film, or a metal nitride film (e.g., an aluminum nitride film) can be used, for example.

In this embodiment, an aluminum oxide film is formed as the insulating layer 407a by a sputtering method, and a silicon oxide film with a thickness of 100 nm is formed as the insulating layer 407b by a sputtering method. The silicon oxide film can be deposited by a sputtering method under a rare gas (typically, argon) atmosphere, an oxygen atmosphere, or a mixed atmosphere containing a rare gas and oxygen.

The insulating layers 407a and 407b are preferably formed appropriately using a method such as a sputtering method, in which an impurity such as water or hydrogen does not enter the insulating layers 407a and 407b.

In order to remove residual moisture from the deposition chamber in which the insulating layers 407a and 407b are to be formed in a manner similar to the deposition of the oxide semiconductor film, an entrapment vacuum pump (such as a cryopump) is preferably used. The insulating layers 407a and 407b are deposited in the deposition chamber in which evacuation has been performed with a cryopump, whereby the concentration of impurities in the insulating layers 407a and 407b can be reduced. In addition, as an evacuation unit for removing moisture remaining in the deposition chamber in which the insulating layers 407a and 407b are to be formed, a turbo molecular pump provided with a cold trap may be used.

A high-purity gas from which impurities such as hydrogen, water, a hydroxyl group, and hydride have been removed is preferably used as a sputtering gas used in the deposition of the insulating layers 407a and 407b.

The aluminum oxide film which is used for the insulating layer 407a or 407b and provided over the oxide semiconductor film 403 has a high shielding effect (blocking effect) of preventing penetration of both oxygen and an impurity such as hydrogen or moisture.

Therefore, in and after the manufacturing process, the aluminum oxide film functions as a protective film for preventing entry of an impurity such as hydrogen or moisture, which causes a change of characteristics of the transistor, into the oxide semiconductor film 403 and release of oxygen, which is a main constituent material of the oxide semiconductor, from the oxide semiconductor film 403.

Further, a planarization insulating film may be formed thereover in order to reduce surface roughness due to the transistor. As the planarization insulating film, an organic material such as a polyimide-, acrylic-, or benzocyclobutene-based resin can be used. Other than such organic materials, it is also possible to use a low-dielectric constant material (a low-k material) or the like. Note that the planarization insulating film may be formed by stacking a plurality of insulating films formed from these materials.

Openings reaching the oxide semiconductor film 403 (the low-resistance regions 404a and 404b) are formed in the gate insulating film 402 and the insulating layers 407a and 407b. Then, the wiring layers 465a and 465b functioning as a source electrode layer and a drain electrode layer are formed in the openings (see FIG. 1E). The transistor is connected to another transistor with the use of the wiring layers 465a and 465b, so that a variety of circuits can be formed.

The wiring layers 465a and 465b can be formed using a material and a method which are similar to those for the gate electrode layer 401. For example, a metal film containing an element selected from Al, Cr, Cu, Ta, Ti, Mo, and W, or a metal nitride film containing any of the above elements as a component (a titanium nitride film, a molybdenum nitride film, or a tungsten nitride film) can be used. A metal film having a high melting point such as Ti, Mo, W, or the like or a metal nitride film of any of these elements (a titanium nitride film, a molybdenum nitride film, and a tungsten nitride film) may be stacked on one of or both of a lower side and an upper side of a metal film of Al, Cu, or the like. As the conductive film used for the wiring layers 465a and 465b, a conductive metal oxide may be used. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials in which silicon oxide is contained can be used.

For example, as the wiring layers 465a and 465b, a single layer of a molybdenum film, a stack of a tantalum nitride film and a copper film, a stack of a tantalum nitride film and a tungsten film, or the like can be used.

As described above, the oxide semiconductor film which contains at least four kinds of elements of indium, gallium, zinc, and oxygen and contains a large amount of oxygen, and in which the percentage of the indium is twice or more as large as each of the percentage of the gallium and the percentage of the zinc when the composition of the four elements is expressed in atomic percentage is used as the semiconductor layer in the transistor 440, and the high-density aluminum oxide film covers the transistor 440, whereby the transistor 440 can have sufficient electrical characteristics to function as a transistor even when the transistor 440 is miniaturized.

Accordingly, a semiconductor device which is miniaturized and has good electrical characteristics and a method for manufacturing the semiconductor device can be provided.

Embodiment 2

In this embodiment, an example of a semiconductor device which includes the transistor described in this specification, which can hold stored data even when not powered, and which does not have a limitation on the number of write cycles, will be described with reference to drawings.

Figure 4A:
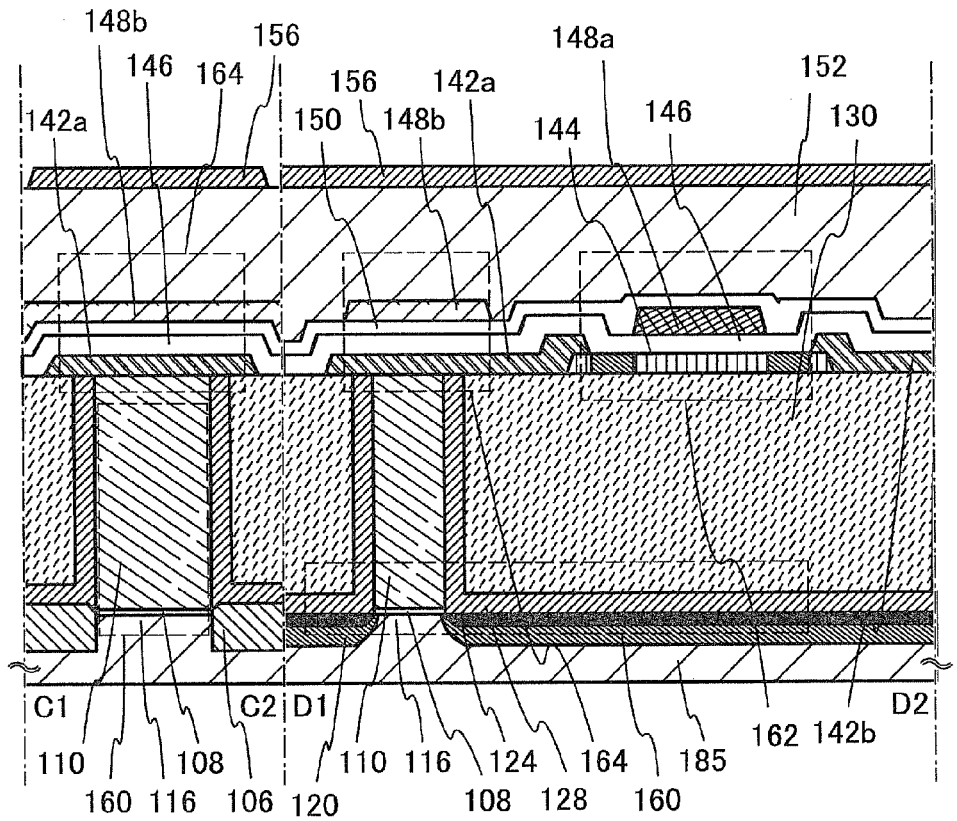
FIGS. 4A to 4C are a cross-sectional view, a plan view, and a circuit diagram illustrating one embodiment of a semiconductor device.
Figure 4B:
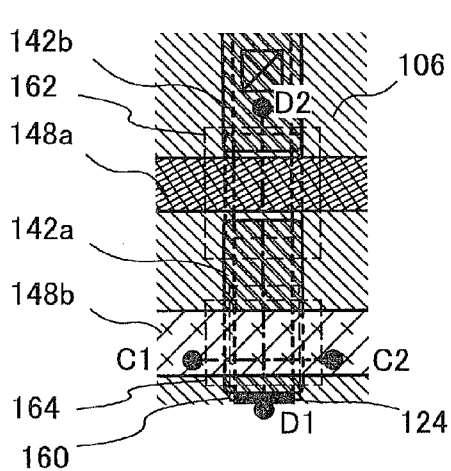
Figure 4C:
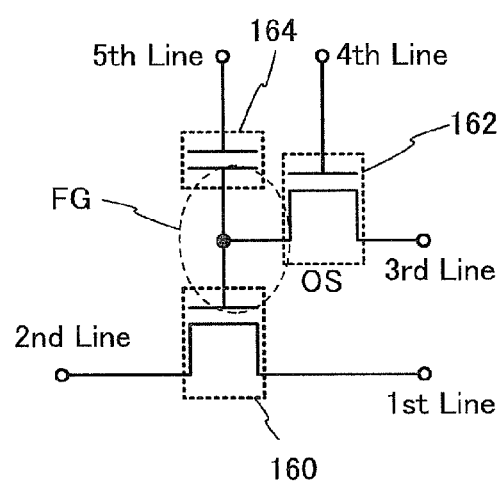

FIGS. 4A to 4C illustrate an example of the structure of a semiconductor device. FIGS. 4A to 4C illustrate a cross-sectional view, a plan view, and a circuit diagram, respectively, of the semiconductor device. Here, FIG. 4A corresponds to cross sections taken along line C1-C2 and line D1-D2 in FIG. 4B.

The semiconductor device illustrated in FIGS. 4A and 4B includes a transistor 160 including a first semiconductor material in a lower portion, and a transistor 162 including a second semiconductor material in an upper portion. The structure of the transistor described in Embodiment 1 can be applied to the transistor 162. The transistor 162 is an example in which an electrode layer 142a and an electrode layer 142b are provided in contact with an oxide semiconductor film 144.

In the transistor 162, the electrode layer 142a and the electrode layer 142b serve as masks at the time of introducing the dopant; therefore, a low-resistance region is not formed in regions of the oxide semiconductor film 144 which are located below the electrode layer 142a and the electrode layer 142b.

Depending on the thicknesses of the electrode layer 142a and the electrode layer 142b and conditions for introducing the dopant, the dopant might also be introduced to the regions of the oxide semiconductor film 144 below the electrode layer 142a and the electrode layer 142b, or when the dopant is introduced to the regions, the regions of the oxide semiconductor film 144 below the electrode layer 142a and the electrode layer 142b might have a low dopant concentration and a higher resistance than low-resistance regions except the regions located below the electrode layer 142a and the electrode layer 142b.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, a transistor including an oxide semiconductor enables charge to be held for a long time owing to its characteristics.

Although the above-described the transistors are n-channel transistors here, it is needless to say that p-channel transistors can be used. The specific constituent of the semiconductor device is not necessarily limited to those described here such as the material used for the semiconductor device and the structure of the semiconductor device (e.g., the use of the transistor described in Embodiment 1, which is formed using an oxide semiconductor, as the transistor 162 for holding information).

The transistor 160 in FIG. 4A includes a channel formation region 116 provided in a substrate 185 including a semiconductor material (e.g., silicon), impurity regions 120 provided such that the channel formation region 116 is sandwiched therebetween, intermetallic compound regions 124 in contact with the impurity regions 120, a gate insulating layer 108 provided over the channel formation region 116, and a gate electrode 110 provided over the gate insulating layer 108. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode," and a drain region and a drain electrode are collectively referred to as a "drain electrode". That is, in this specification, the term "source electrode" may include a source region.

An element isolation insulating layer 106 is provided over the substrate 185 to surround the transistor 160. An insulating layer 128 and an insulating layer 130 are provided to cover the transistor 160. Note that in order to achieve high integration, the transistor 160 preferably has a structure without a sidewall insulating layer as illustrated in FIG. 4A. On the other hand, when the characteristics of the transistor 160 have priority, the sidewall insulating layer may be formed on a side surface of the gate electrode 110 and the impurity regions 120 may include a region having a different impurity concentration.

The transistor 160 formed using a single crystal semiconductor substrate can operate at high speed. Thus, when the transistor is used as a reading transistor, data can be read at a high speed. Two insulating films are formed so as to cover the transistor 160. As treatment prior to formation of the transistor 162 and a capacitor 164, CMP treatment is performed on the two insulating films so that the insulating layer 128 and the insulating layer 130 are formed to be planarized and an upper surface of the gate electrode 110 is exposed.

As each of the insulating layer 128 and the insulating layer 130, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can be used typically. The insulating layer 128 and the insulating layer 130 can be formed by a plasma CVD method, a sputtering method, or the like.

Alternatively, an organic material such as polyimide, an acrylic resin, or a benzocyclobutene resin can be used. Other than such organic materials, it is also possible to use a low-dielectric constant material (a low-k material) or the like. In the case of using an organic material, a wet process such as a spin coating method or a printing method may be used to form the insulating layer 128 and the insulating layer 130.

Note that in this embodiment, a silicon nitride film is used as the insulating layer 128, and a silicon oxide layer is used as the insulating layer 130.

The oxide semiconductor film 144 is formed over the insulating layer 130 which is sufficiently planarized by polishing treatment (e.g., CMP treatment) so that the average surface roughness of the insulating layer 130 is less than or equal to 0.15 nm.

The transistor 162 illustrated in FIG. 4A includes an oxide semiconductor in the channel formation region. Here, the oxide semiconductor film 144 included in the transistor 162 is preferably highly purified. By using a highly purified oxide semiconductor, the transistor 162 which has extremely favorable off-state current characteristics can be obtained.

Since the off-state current of the transistor 162 is small, stored data can be held for a long time by using such a transistor. In other words, power consumption can be sufficiently reduced because a semiconductor device in which refresh operation is unnecessary or the frequency of refresh operation is extremely low can be provided.

An insulating layer 150 having a single-layer structure or a stacked-layer structure is provided over the transistor 162. In this embodiment, a stack in which an aluminum oxide film and a silicon oxide film are stacked from a gate electrode 148a side is used as the insulating layer 150. The density of the aluminum oxide film is made to be high (the film density is higher than or equal to 3.2 g/cm$^3$, preferably higher than or equal to 3.6 g/cm$^3$), whereby stable electrical characteristics can be given to the transistor 162.

In addition, a conductive layer 148b is provided in a region overlapping with the electrode layer 142a of the transistor 162 with the insulating layer 150 provided therebetween, and the electrode layer 142a, the insulating layer 150, and the conductive layer 148b form a capacitor 164. That is, the electrode layer 142a of the transistor 162 functions as one electrode of the capacitor 164, and the conductive layer 148b functions as the other electrode of the capacitor 164. Note that the capacitor 164 may be omitted if a capacitor is not needed. Alternatively, the capacitor 164 may be separately provided above the transistor 162.

The insulating layer 152 is provided over the transistor 162 and the capacitor 164. Further, a wiring 156 for connecting the transistor 162 to another transistor is provided over the insulating layer 152. Although not illustrated in FIG. 4A, the wiring 156 is electrically connected to the electrode layer 142b through an electrode formed in an opening provided in the insulating layer 150, the insulating layer 152, a gate insulating film 146, and the like. Here, the electrode is preferably provided so as to partly overlap with at least the oxide semiconductor film 144 of the transistor 162.

In FIGS. 4A and 4B, the transistor 160 and the transistor 162 are provided so as to at least partly overlap with each other. The source region or the drain region of the transistor 160 is preferably provided so as to overlap with part of the oxide semiconductor film 144. Further, the transistor 162 and the capacitor 164 are provided so as to overlap with at least part of the transistor 160. For example, the conductive layer 148b of the capacitor 164 is provided so as to overlap with at least part of the gate electrode 110 of the transistor 160. With such a planar layout, the area occupied by the semiconductor device can be reduced; thus, higher integration can be achieved.

Note that the electrical connection between the electrode layer 142b and the wiring 156 may be established by direct contact of the electrode layer 142b and the wiring 156 with each other or through an electrode provided in an insulating layer lying therebetween. Alternatively, the electrical connection may be established through a plurality of electrodes.

Next, an example of a circuit configuration corresponding to FIGS. 4A and 4B is illustrated in FIG. 4C.

In FIG. 4C, a first wiring (1st line) is electrically connected to a source electrode of the transistor 160. A second wiring (2nd line) is electrically connected to a drain electrode of the transistor 160. A third wiring (3rd line) is electrically connected to one of a source electrode and a drain electrode of the transistor 162, and a fourth wiring (4th line) is electrically connected to a gate electrode of the transistor 162. A gate electrode of the transistor 160 and the one of the source electrode and the drain electrode of the transistor 162 are electrically connected to one electrode of the capacitor 164. A fifth line (5th line) is electrically connected to the other electrode of the capacitor 164.

The semiconductor device in FIG. 4C utilizes a characteristic in which the potential of the gate electrode of the transistor 160 can be held, and can thus write, hold, and read data as follows.

Writing and holding of data is described. First, the potential of the fourth line is set to a potential at which the transistor 162 is turned on, so that the transistor 162 is turned on. Accordingly, the potential of the third line is supplied to the gate electrode of the transistor 160 and the capacitor 164. That is, predetermined charge is given to the gate electrode of the transistor 160 (writing). Here, charge for supply of a potential level or charge for supply of a different potential level (hereinafter referred to as Low level charge and High level charge) is given. After that, the potential of the fourth line is set to a potential at which the transistor 162 is turned off, so that the transistor 162 is turned off. Thus, the charge given to the gate electrode of the transistor 160 is held (holding).

Since the off-state current of the transistor 162 is extremely low, the charge of the gate electrode of the transistor 160 is held for a long time.

Next, reading of data is described. By supplying an appropriate potential (reading potential) to the fifth line while a predetermined potential (constant potential) is supplied to the first line, the potential of the second line varies depending on the amount of charge held in the gate electrode of the transistor 160. This is because in general, when the transistor 160 is an n-channel transistor, an apparent threshold voltage $V_{th\_H}$ in the case where a high-level charge is given to the gate electrode of the transistor 160 is lower than an apparent threshold voltage $V_{th\_L}$ in the case where a low-level charge is given to the gate electrode of the transistor 160. Here, an apparent threshold voltage refers to the potential of the fifth line, which is needed to turn on the transistor 160. Thus, the potential of the fifth line is set to a potential $V_0$ that is between $V_{th\_H}$ and $V_{th\_L}$, whereby charge given to the gate electrode of the transistor 160 can be determined. For example, in the case where a high-level charge is given in writing, when the potential of the fifth wiring is set to $V_0$ ($>V_{th\_H}$), the transistor 160 is turned on. In the case where a low level charge is given in writing, even when the potential of the fifth wiring is set to $V_0$ ($<V_{th\_L}$), the transistor 160 remains in an off state. Therefore, the data held can be read by the potential of the second line.

Note that in the case where memory cells are arrayed to be used, only data of desired memory cells needs to be read. In the case where such reading is not performed, a potential at which the transistor 160 is turned off, that is, a potential smaller than $V_{th\_H}$ may be given to the fifth wiring regardless of the state of the gate electrode of the transistor 160. Alternatively, a potential which allows the transistor 160 to be turned on regardless of a state of the gate electrode, that is, a potential higher than $V_{th\_L}$ may be applied to the fifth line.

When a transistor having a channel formation region formed using an oxide semiconductor and having extremely small off-state current is applied to the semiconductor device in this embodiment, the semiconductor device can held stored data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate, and thus a problem such as deterioration of a gate insulating layer does not occur at all. In other words, the semiconductor device according to one embodiment of the present invention does not have a limit on the number of times of writing which is a problem in a conventional non-volatile memory, and reliability thereof is drastically improved. Furthermore, data is written depending on the on state and the off state of the transistor, whereby high-speed operation can be easily realized.

The oxide semiconductor film 144 which contains at least four kinds of elements of indium, gallium, zinc, and oxygen and contains a large amount of oxygen, and in which the percentage of the indium is twice or more as large as each of the percentage of the gallium and the percentage of the zinc when the composition of the four elements is expressed in atomic percentage is used as the semiconductor layer in the transistor 162, and the high-density aluminum oxide film covers the transistor 162, whereby the transistor 162 can have sufficient electrical characteristics to function as a transistor even when the transistor 162 is miniaturized.

Accordingly, a semiconductor device which is miniaturized and has good electrical characteristics and a method for manufacturing the semiconductor device can be provided.

The methods and structures described in this embodiment can be combined as appropriate with any of the methods and structures described in the other embodiments.

Embodiment 3

In this embodiment, a semiconductor device which includes the transistor described in Embodiment 1 or 2, can hold stored data even when not powered, and does not have a limitation on the number of write cycles, and which has a structure different from the structure described in Embodiment 2 is described with reference to FIGS. 5A and 5B and FIGS. 6A to 6C.

Figure 5A:
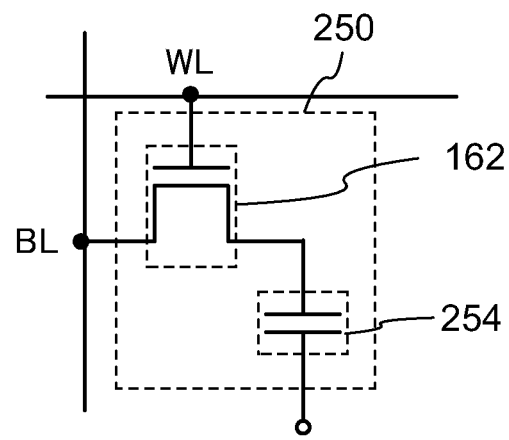
FIGS. 5A and 5B are a circuit diagram and a perspective view illustrating one embodiment of a semiconductor device.
Figure 5B:
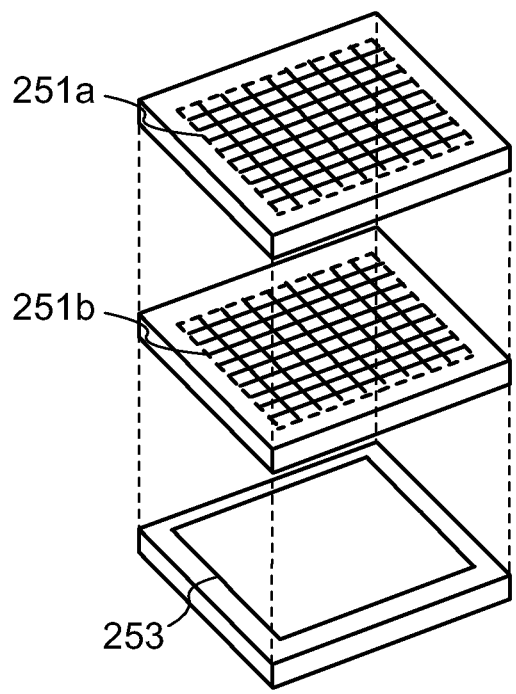

FIG. 5A illustrates an example of a circuit configuration of a semiconductor device, and FIG. 5B is a conceptual diagram illustrating an example of a semiconductor device. First, the semiconductor device illustrated in FIG. 5A is described, and then, the semiconductor device illustrated in FIG. 5B is described.

In the semiconductor device illustrated in FIG. 5A, a bit line BL is electrically connected to a source electrode or a drain electrode of a transistor 162, a word line WL is electrically connected to a gate electrode of the transistor 162, and the source electrode or the drain electrode of the transistor 162 is electrically connected to a first terminal of a capacitor 254.

Off current is extremely small in the transistor 162 formed using an oxide semiconductor. For that reason, the potential of the first terminal of the capacitor 254 (or a charge accumulated in the capacitor 254) can be held for an extremely long period by turning off the transistor 162.

Next, writing and holding of data in the semiconductor device (a memory cell 250) illustrated in FIG. 5A will be described.

First, the potential of the word line WL is set to a potential at which the transistor 162 is turned on, so that the transistor 162 is turned on. Accordingly, the potential of the bit line BL is supplied to the first terminal of the capacitor 254 (writing). After that, the potential of the word line WL is set to a potential at which the transistor 162 is turned off, so that the transistor 162 is turned off. Thus, the potential of the first terminal of the capacitor 254 is held (holding).

Since the off-state current of the transistor 162 is extremely small, the potential of the first terminal of the capacitor 254 (or the charge accumulated in the capacitor) can be held for a long time.

Next, reading of data is described. When the transistor 162 is turned on, the bit line BL which is in a floating state and the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL obtained after charge redistribution is $(CB*VB0+C*V)/(CB+C)$, where V is the potential of the first terminal of the capacitor 254, C is the capacitance of the capacitor 254, CB is the capacitance of the bit line BL (hereinafter also referred to as bit line capacitance), and VB0 is the potential of the bit line BL obtained before the charge redistribution. Therefore, it can be found that the potential of the bit line BL, in the case of holding the potential V1, $(=(CB*VB0+C*V1)/(CB+C))$ is higher than the potential of the bit line BL, in the case of holding the potential V0, $(=(CB*VB0+C*V0)/(CB+C))$ assuming that the memory cell 250 is in either of two states in which the potentials of the first terminal of the capacitor 254 are V1 and V0 (V1>V0).

Then, by comparing the potential of the bit line BL with a predetermined potential, data can be read.

As described above, the semiconductor device illustrated in FIG. 5A can hold charge that is accumulated in the capacitor 254 for a long time because the off-state current of the transistor 162 is extremely small. In other words, power consumption can be adequately reduced because refresh operation becomes unnecessary or the frequency of refresh operation can be extremely low. Moreover, stored data can be stored for a long time even when power is not supplied.

Next, the semiconductor device illustrated in FIG. 5B is described.

The semiconductor device illustrated in FIG. 5B includes memory cell arrays 251a and 251b including a plurality of memory cells 250 illustrated in FIG. 5A as memory circuits in an upper portion, and a peripheral circuit 253 in a lower portion which is necessary for operating memory cell arrays 251 (the memory cell arrays 251a and 251b). Note that the peripheral circuit 253 is electrically connected to the memory cell array 251.

In the structure illustrated in FIG. 5B, the peripheral circuit 253 can be provided directly under the memory cell arrays 251 (the memory cell arrays 251a and 251b). Thus, the size of the semiconductor device can be decreased.

It is preferable that a semiconductor material of the transistor provided in the peripheral circuit 253 is different from that of the transistor 162. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, a variety of circuits (e.g., a logic circuit or a driver circuit) which needs to operate at high speed can be favorably achieved by using the transistor.

Note that FIG. 5B illustrates, as an example, the semiconductor device in which two memory cell arrays 251 (the memory cell arrays 251a and 251b) are stacked; however, the number of memory cells to be stacked is not limited thereto. Three or more memory cells may be stacked.

Next, a specific structure of the memory cell 250 illustrated in FIG. 5A is described with reference to FIGS. 6A to 6C.

Figure 6A:
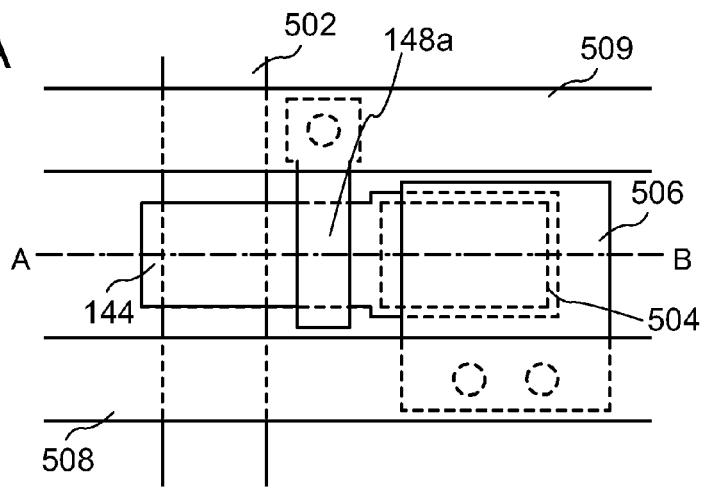
FIGS. 6A to 6C are a plan view and cross-sectional views illustrating one embodiment of a semiconductor device.
Figure 6B:
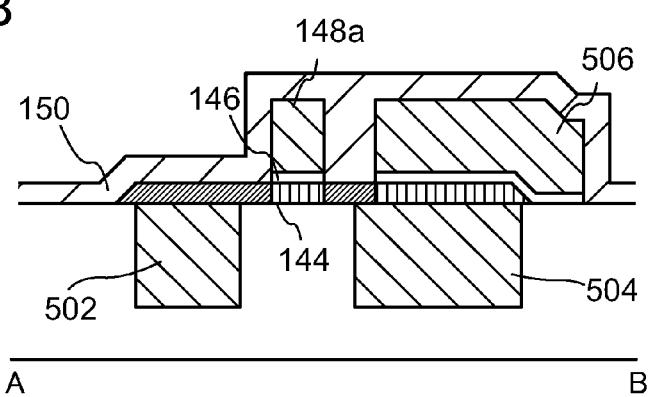
Figure 6C:
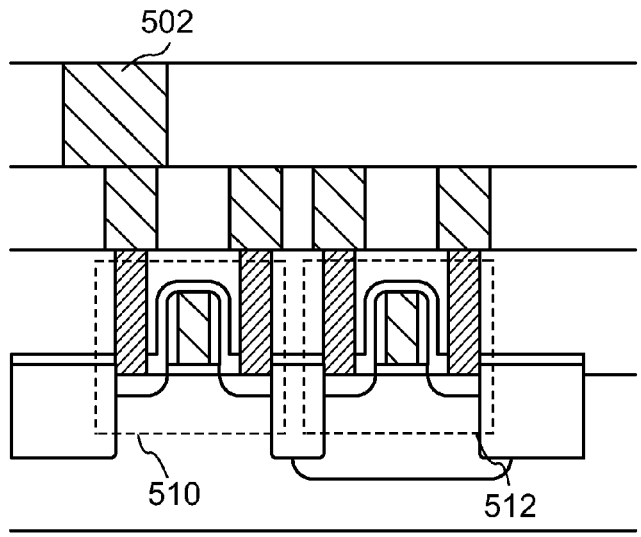

FIGS. 6A to 6C illustrate an example of the structure of the memory cell 250. FIG. 6A is a plan view of the memory cell 250. FIG. 6B is a cross-sectional view taken along line A-B in FIG. 6A.

The memory cell illustrated in FIGS. 6A and 6B includes the transistor 162 illustrated in FIG. 5A. The transistor 162 can have the same structure as the structure described in Embodiment 1 or 2.

As illustrated in FIG. 6B, the transistor 162 is provided over an electrode 502 and an electrode 504. The electrode 502 functions as the bit line BL in FIG. 5A and is in contact with a low-resistance region of the transistor 162. The electrode 504 serves as one electrode of the capacitor 254 in FIG. 5A and is in contact with the low-resistance region of the transistor 162. Over the transistor 162, an electrode 506 which is provided in a region overlapping with the electrode 504 serves as the other electrode of the capacitor 254.

As illustrated in FIG. 6A, the other electrode 506 of the capacitor 254 is electrically connected to a capacitor line 508. A gate electrode 148a which is provided over an oxide semiconductor film 144 with a gate insulating film 146 provided therebetween is electrically connected to a word line 509.

FIG. 6C is a cross-sectional view in a connection portion between the memory cell array 251 and the peripheral circuit. The peripheral circuit can include, for example, an n-channel transistor 510 and a p-channel transistor 512. The n-channel transistor 510 and the p-channel transistor 512 are preferably formed using a semiconductor material other than an oxide semiconductor (e.g., silicon). With such a material, the transistor included in the peripheral circuit can operate at high speed.

When the planar layout in FIG. 6A is employed, the area occupied by the semiconductor device can be reduced; thus, the degree of integration can be increased.

As described above, the plurality of memory cells formed in multiple layers in the upper portion is each formed with a transistor including an oxide semiconductor. Since the transistor including an oxide semiconductor which contains at least four kinds of elements of indium, gallium, zinc, and oxygen and in which the percentage of the indium is twice or more as large as each of the percentage of the gallium and the percentage of the zinc when the composition of the four elements is expressed in atomic percentage has low off-state current, stored data can be held for a long time by using the transistor. In other words, the frequency of refresh operation can be extremely lowered, which leads to a sufficient reduction in power consumption. Further, as illustrated in FIG. 6B, the capacitor 254 is formed by stacking the electrode 504, the oxide semiconductor film 144, the gate insulating film 146, and the electrode 506. Since the relative permittivity of the oxide semiconductor film with the above-described composition is extremely high (a relative permittivity of 66), the area required for the capacitor 254 can be reduced when the oxide semiconductor film is used as a dielectric film.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, the use of a structure where the peripheral circuit and the memory circuit are stacked leads to an increase in the degree of integration of the semiconductor device.

This embodiment can be implemented in appropriate combination with any of the structures described in the other embodiments.

Embodiment 4

In this embodiment, examples of application of the semiconductor device described in any of the above embodiments to portable devices such as mobile phones, smartphones, and e-book readers will be described with reference to FIGS. 7A and 7B, FIG. 8, FIG. 9, and FIG. 10.

In portable electronic devices such as mobile phones, smartphones, and e-book readers, an SRAM or a DRAM is used to store image data temporarily. This is because response speed of a flash memory is low and thus a flash memory is not suitable for image processing. On the other hand, an SRAM or a DRAM has the following characteristics when used for temporary storage of image data.

Figure 7A:
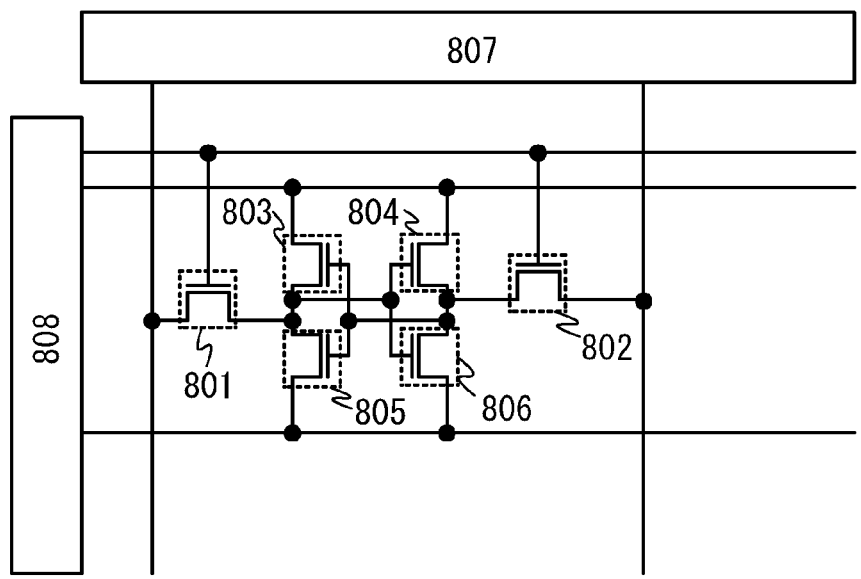
FIGS. 7A and 7B are circuit diagrams illustrating one embodiment of a semiconductor device.

In a normal SRAM, as illustrated in FIG. 7A, one memory cell includes six transistors, which are a transistor 801, a transistor 802, a transistor 803, a transistor 804, a transistor 805, and a transistor 806, and they are driven by an X decoder 807 and a Y decoder 808. The transistors 803 and 805 and the transistors 804 and 806 each serve as an inverter, and high-speed driving can be performed therewith. However, an SRAM has a disadvantage of large cell area because one memory cell includes six transistors. Provided that the minimum feature size of a design rule is F, the area of a memory cell in an SRAM is generally 100 $F^2$ to 150 $F^2$. Therefore, a price per bit of an SRAM is the most expensive among a variety of memory devices.

Figure 7B:
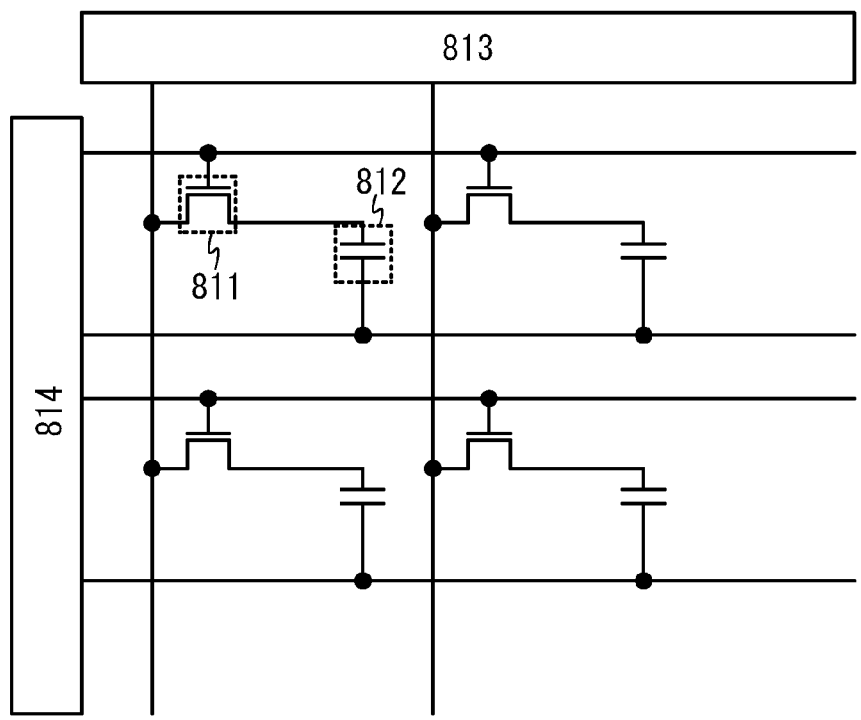

On the other hand, as illustrated in FIG. 7B, a memory cell in a DRAM includes a transistor 811 and a storage capacitor 812, and is driven by an X decoder 813 and a Y decoder 814. One cell includes one transistor and one capacitor and thus the area of a memory cell is small. The area of a memory cell of a DRAM is generally less than or equal to 10 $F^2$. Note that in the case of a DRAM, a refresh operation is always necessary and power is consumed even when a rewriting operation is not performed.

However, the area of the memory cell of the semiconductor device described the above embodiments is about 10 $F^2$ and frequent refreshing is not needed. Therefore, the area of the memory cell is reduced, and the power consumption can be reduced.

Figure 8:
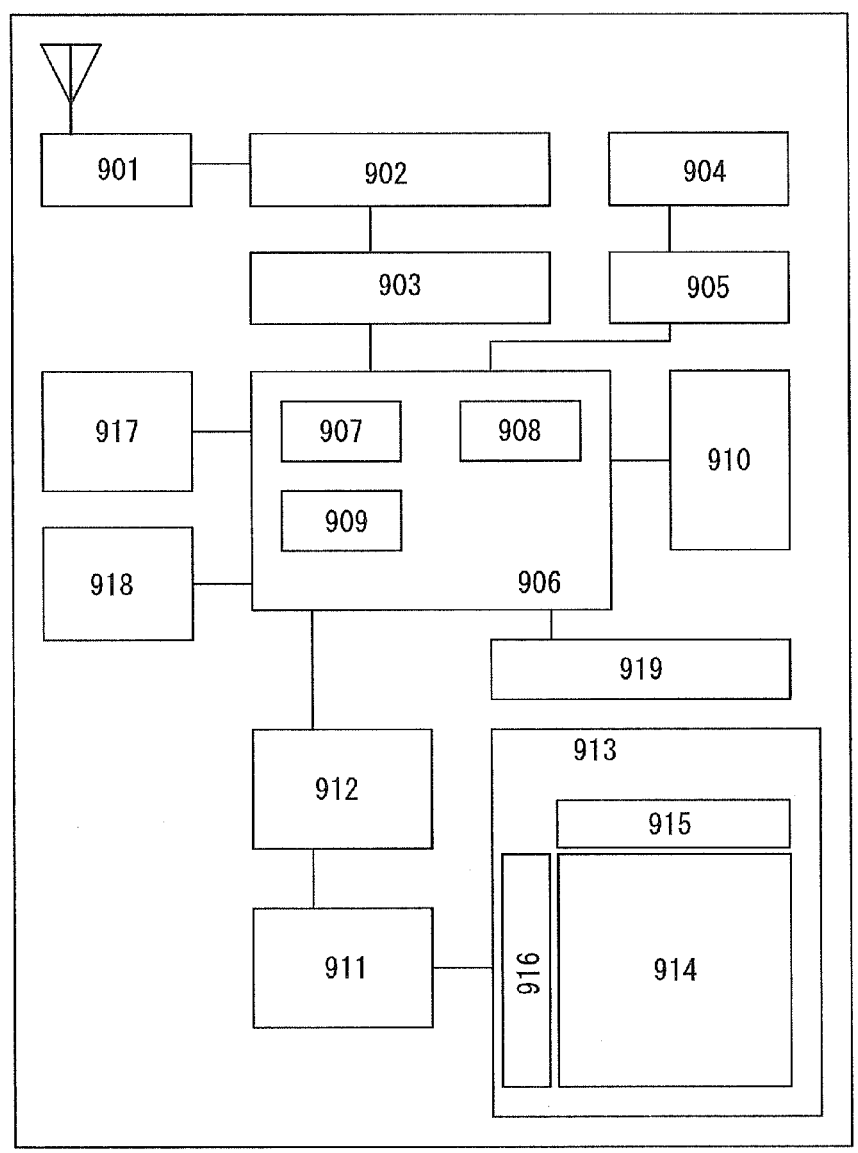
FIG. 8 is a block diagram illustrating one embodiment of a semiconductor device.

Next, a block diagram of a portable device is illustrated in FIG. 8. A portable device illustrated in FIG. 8 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface 909 (IF 909). In general, the memory circuit 912 includes an SRAM or a DRAM; by employing the semiconductor device described in any of the above embodiments for the memory circuit 912, writing and reading of data can be performed at high speed, data can be held for a long time, and power consumption can be sufficiently reduced.

Figure 9:
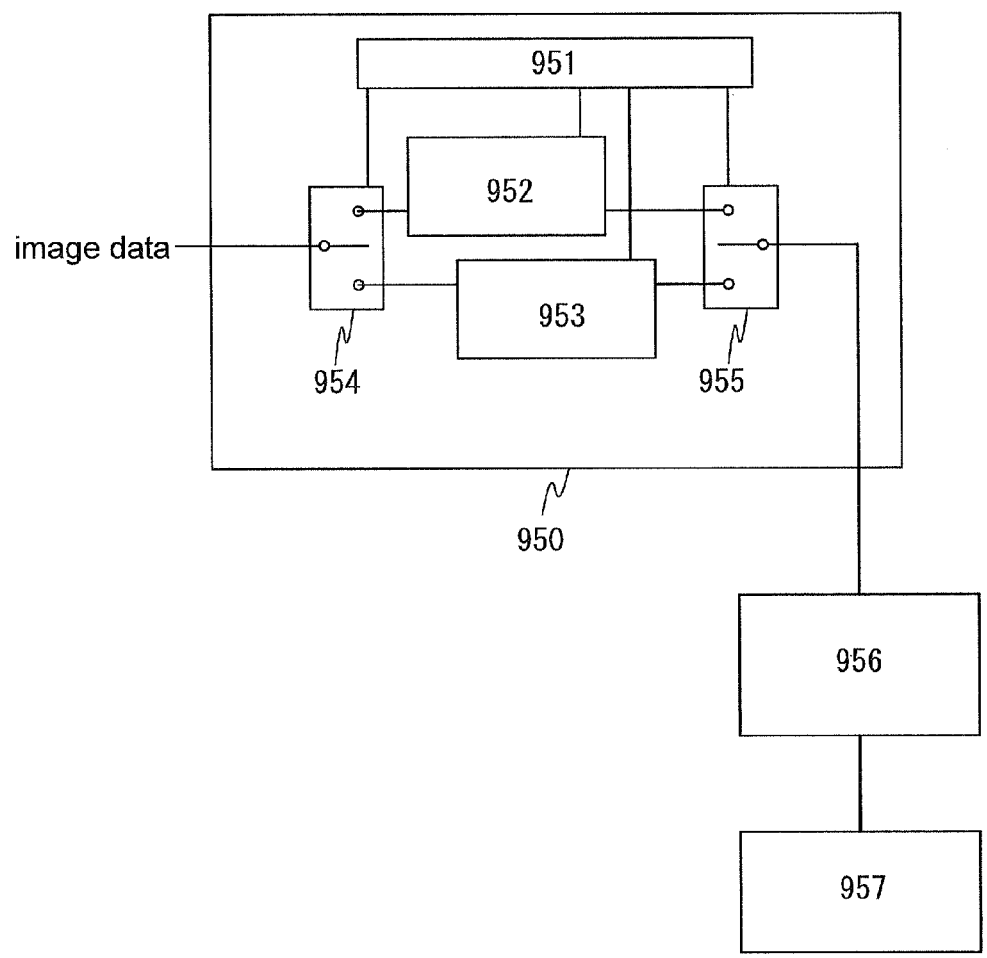
FIG. 9 is a block diagram illustrating one embodiment of a semiconductor device.

Next, FIG. 9 shows an example in which the semiconductor device described in any of the above embodiments is used for a memory circuit 950 in a display. The memory circuit 950 illustrated in FIG. 9 includes a memory 952, a memory 953, a switch 954, a switch 955, and a memory controller 951. Further, the memory circuit is connected to a display controller 956 which reads and controls image data input through a signal line (input image data) and data stored in the memories 952 and 953 (stored image data), and is also connected to a display 957 which displays an image based on a signal input from the display controller 956.

First, image data (input image data A) is formed by an application processor (not shown). The input image data A is stored in the memory 952 though the switch 954. The image data (stored image data A) held in the memory 952 is transmitted and displayed to the display 957 through the switch 955 and the display controller 956.

In the case where the input image data A is not changed, the stored image data A is read from the display controller 956 through the memory 952 and the switch 955 with a frequency of 30 Hz to 60 Hz in general.

Next, for example, when data displayed on the screen is rewritten by a user (that is, in the case where the input image data A is changed), new image data (input image data B) is formed by the application processor. The input image data B is held in the memory 953 through the switch 954. The stored image data A is read periodically from the memory 952 through the switch 955 even during that time. After the completion of storing the new image data (the stored image data B) in the memory 953, from the next frame for the display 957, the stored image data B starts to be read, transmitted to the display 957 through the switch 955 and the display controller 956, and displayed on the display 957. This reading operation is continued until another new image data is held in the memory 952.

By alternately writing and reading image data to and from the memory 952 and the memory 953 as described above, images are displayed on the display 957. Note that the memory 952 and the memory 953 are not limited to separate memories, and a single memory may be divided and used. By employing the semiconductor device described in any of the above embodiments for the memory 952 and the memory 953, data can be written and read at high speed and held for a long time, and power consumption can be sufficiently reduced.

Figure 10:
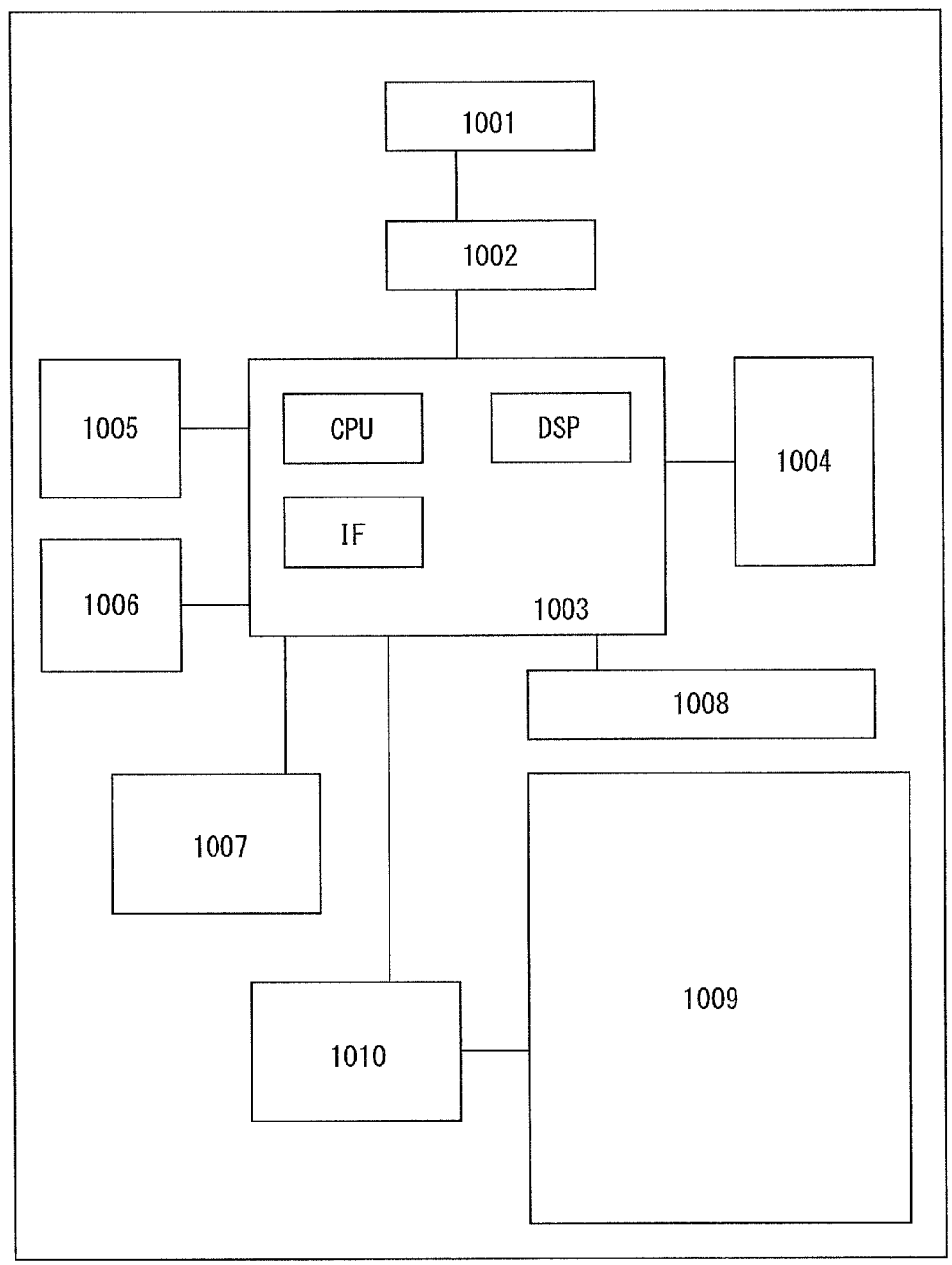
FIG. 10 is a block diagram illustrating an embodiment of a semiconductor device.

Next, FIG. 10 is a block diagram of an e-book reader. FIG. 10 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 10. The memory circuit 1007 has a function of temporarily storing the contents of a book. For example, users use a highlight function in some cases. When users read an e-book reader, they sometimes want to mark a specified place. This marking refers to a highlight function, and users can make difference from other places by, for example, changing the color of a letter displayed, underlining a word, making a letter bold, or changing the font type of a letter. That is, there is a function of storing and holding information of a place specified by users. In order to save information for a long time, the information may be copied into the flash memory 1004. Even in such a case, by employing the semiconductor device described in any of the above embodiments, writing and reading of data can be performed at high speed, data can be held for a long time, and power consumption can be sufficiently reduced.

As described above, the semiconductor device in any of the above embodiments is mounted on each of the portable devices described in this embodiment. Therefore, a portable electric device in which writing and reading of data are performed at high speed, data is held for a long time, and power consumption is sufficiently reduced, can be obtained.

The structures, methods, and the like described in this embodiment can be combined as appropriate with any of the structures, methods, and the like described in the other embodiments.

Example 1

In this example, transistors including an IGZO film formed using an oxide target having a composition of In:Ga:Zn=3:1:2 [atomic ratio] were manufactured and electrical characteristics of the transistors were evaluated.

As the transistors, Example transistor 1 and Example transistor 2 which had structures similar to the structure of the transistor 440 illustrated in FIGS. 1A to 1E were manufactured. A method for manufacturing Example transistor 1 and Example transistor 2 is described below.

As an insulating layer, a silicon oxide film with a thickness of 300 nm was deposited over a glass substrate by a sputtering method (deposition conditions: an oxygen atmosphere (oxygen=50 sccm), a pressure of 0.4 Pa, a power (power output) of 1.5 kW, a distance between the glass substrate and the target of 60 mm, and a substrate temperature of 100° C.).

Next, a surface of the silicon oxide film was polished by a chemical mechanical polishing (CMP) method (the polishing pressure: 0.001 MPa; the polishing time: 0.5 minutes), so that the average surface roughness (Ra) of the surface of the silicon oxide film was approximately 0.15 nm.

After the surface of the silicon oxide film was subjected to polishing treatment, an IGZO film with a thickness of 20 nm was formed as an oxide semiconductor film, by a sputtering method with the use of an oxide target having a composition of In:Ga:Zn=3:1:2 [atomic ratio]. Deposition conditions were as follows: an atmosphere of argon and oxygen (argon:oxygen=30 sccm:15 sccm), a pressure of 0.4 Pa, a power of 0.5 kW, and a substrate temperature of 200° C.

Oxygen ions were implanted to the IGZO film by an ion implantation method. Note that the conditions of the oxygen ion implantation were as follows: an acceleration voltage of 5 kV and a dosage of $5.0 \times 10^{15}$ ions/cm$^2$.

The IGZO film to which oxygen ions were implanted was processed into an island shape by an inductively coupled plasma (ICP) etching (etching conditions: an etching gas of BCl$_3$:Cl$_2$=60 sccm:20 sccm, a power of 450 W, a bias power of 100 W, and a pressure of 1.9 Pa).

Next, a silicon oxynitride film with a thickness of 20 nm was deposited as a gate insulating film by a CVD method.

A stack of a tantalum nitride film with a thickness of 30 nm (deposition conditions: an atmosphere of argon and nitrogen (Ar:N$_2$=50 sccm:10 sccm), a pressure of 0.6 Pa, and a power of 1 kW) and a tungsten film with a thickness of 135 nm (deposition conditions: an argon atmosphere (argon=100 sccm), a pressure of 2.0 Pa, and a power of 4 kW) was deposited over the gate insulating film by a sputtering, and was etched (first etching conditions: an etching gas of CF$_4$: Cl$_2$:O$_2$=55 sccm: 45 sccm: 55 sccm, a power of 3 kW, a bias power of 110 W, and a pressure of 0.67 Pa; second etching conditions: an etching gas of Cl$_2$=100 sccm, a power of 2 kW, and a bias power of 50 W; and third etching conditions: an etching gas of Cl$_2$=100 sccm, a power of 1 kW, and a bias power of 25 W), so that a gate electrode layer was formed.

Phosphorus (P) ions were implanted into the IGZO film with the use of the gate electrode layer, a source electrode layer, and a drain electrode layer as masks. Note that the conditions of the phosphorus (P) ion implantation were as follows: an acceleration voltage of 30 kV and a dosage of $1.0 \times 10^{15}$ ions/cm$^2$.

As an insulating film, an aluminum oxide film with a thickness of 50 nm was deposited over the gate electrode layer by sputtering (deposition conditions: an atmosphere of argon and oxygen (argon: oxygen=25 sccm:25 sccm), a pressure of 0.4 Pa, a power of 2.5 kW, a distance between the glass substrate and the target of 60 mm, and a substrate temperature of 250° C.) and a silicon oxynitride film with a thickness of 300 nm was stacked thereover by a CVD method.

The aluminum oxide film in this example is a high-density aluminum oxide film. The film density of the aluminum oxide film was 3.3 g/cm$^3$ when measured by Rutherford backscattering spectrometry (RBS) and 3.62 g/cm$^3$ when measured by X-ray reflection (XRR). In this example, an aluminum oxide film having an ideal composition of Al$_2$O$_3$ (Z/A=0.4882 (Z is an atomic number and A is a mass number)) was used as a model for theoretical analysis used in the XRR.

Openings reaching the IGZO film were formed in the gate insulating film and the insulating film. Then, a molybdenum film with a thickness of 300 nm was deposited by a sputtering method (deposition conditions: an argon atmosphere (Ar=50 sccm), a pressure of 0.3 Pa, and a power of 2 kW) and was etched (etching conditions: an etching gas of Cl$_2$:CF$_4$:O$_2$=45 sccm: 55 sccm: 55 sccm, a power of 3 kW, a bias power of 140 W, and a pressure of 0.67 Pa), so that wirings functioning as a source electrode layer and a drain electrode layer were formed.

Next, heat treatment was performed at a temperature of 300° C. under an air atmosphere for one hour.

Through the above process, Example transistor 1 and Example transistor 2 were manufactured.

In addition, as comparative examples, transistors (Comparative example transistor 1 and Comparative example transistor 2) were manufactured. Structures and manufacturing methods of Comparative example transistor 1 and Comparative example transistor 2 are similar to those of Example transistor 1 and Example transistor 2 except that the oxygen implantation process was not performed, and a single-layer silicon oxynitride film with a thickness of 300 nm was formed as the insulating film covering the transistor by a CVD method and thus the aluminum oxide film was not formed.

Note that in Example transistor 1 and Comparative example transistor 1, the channel length (L) was 0.25 μm, the channel width (W) was 10 μm, and the distance between the gate electrode layer and the individual opening where the wiring layer was in contact with the oxide semiconductor film was 0.2 μm. On the other hand, in Example transistor 2 and Comparative example transistor 2, the channel length (L) was 0.45 μm, the channel width (W) was 10 μm, and the distance between the gate electrode layer and the individual opening where the wiring layer is in contact with the oxide semiconductor film was 0.2 μm.

Respective electrical characteristics of Example transistor 1, Example transistor 2, Comparative example transistor 1, and Comparative example transistor 2 were evaluated.

Figure 2A:
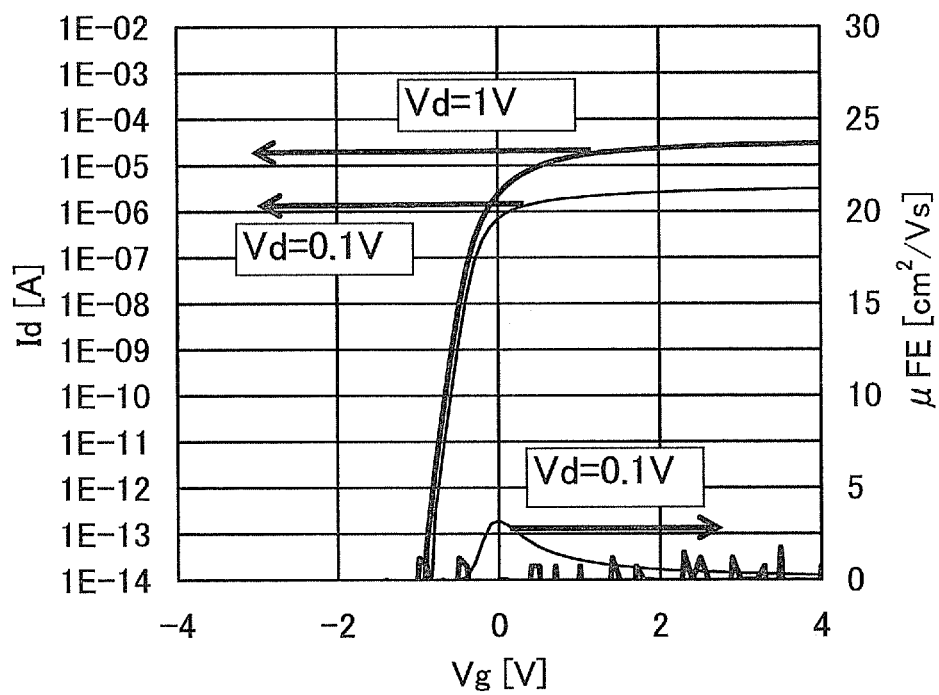
FIGS. 2A and 2B show evaluation of electrical characteristics of Example transistor 1 and Example transistor 2.

FIG. 2A shows the following electrical characteristics of Example transistor 1: gate voltage versus drain current (Vg-Id) characteristics and field-effect mobility (denoted by medium thick lines in FIG. 2A) in the case where the drain voltage (Vd) is 1 V; and gate voltage versus drain current (Vg-Id) characteristics and field-effect mobility (denoted by medium thin lines in FIG. 2A) in the case where the drain voltage (Vd) is 0.1 V.

Figure 2B:
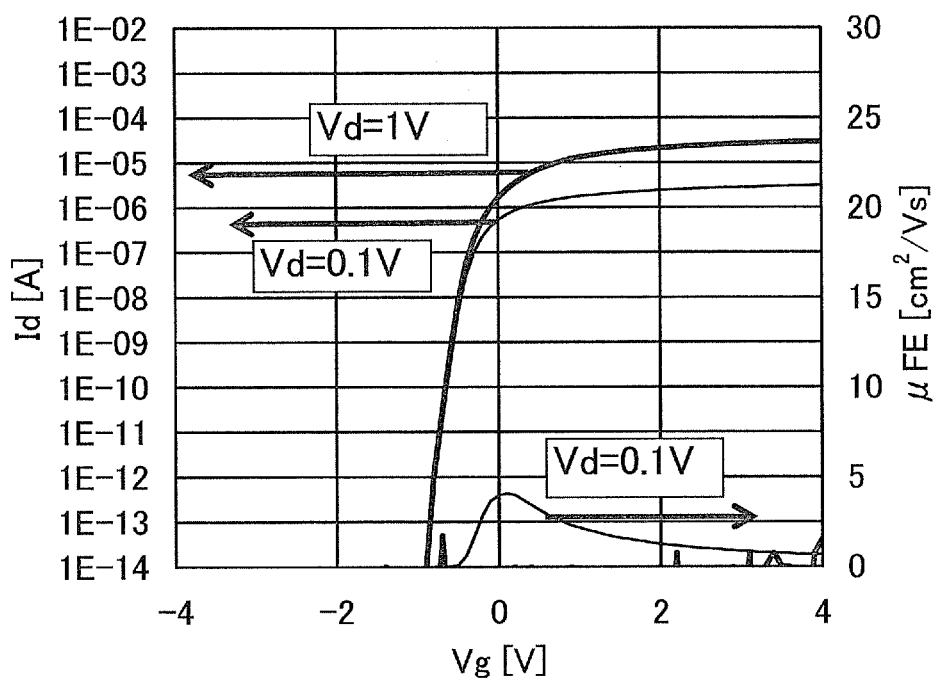

FIG. 2B shows the following electrical characteristics of Example transistor 2: gate voltage versus drain current (Vg-Id) characteristics and field-effect mobility (denoted by medium thick lines in FIG. 2B) in the case where the drain voltage (Vd) is 1 V; and gate voltage versus drain current (Vg-Id) characteristics and field-effect mobility (denoted by medium thin lines in FIG. 2B) in the case where the drain voltage (Vd) is 0.1 V.

Figure 3A:
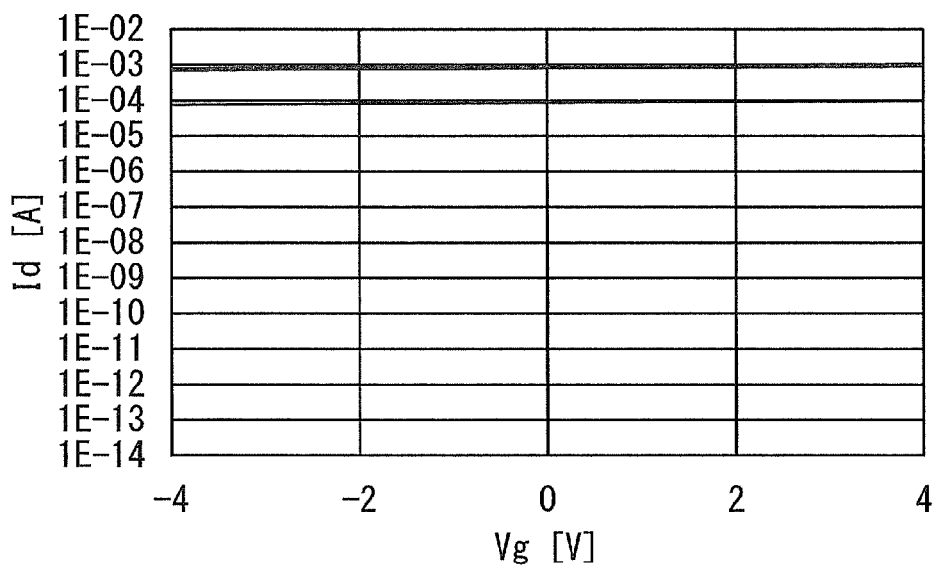
FIGS. 3A and 3B show evaluation of electrical characteristics of Comparative example transistor 1 and Comparative example transistor 2.

FIG. 3A shows the following electrical characteristics of Comparative example transistor 1: gate voltage versus drain current (Vg-Id) characteristics (denoted by a medium thin line in FIG. 3A) in the case where the drain voltage (Vd) is 1 V; gate voltage versus drain current (Vg-Id) characteristics (denoted by a medium thin line in FIG. 3A) in the case where the drain voltage (Vd) is 0.1 V.

Figure 3B:
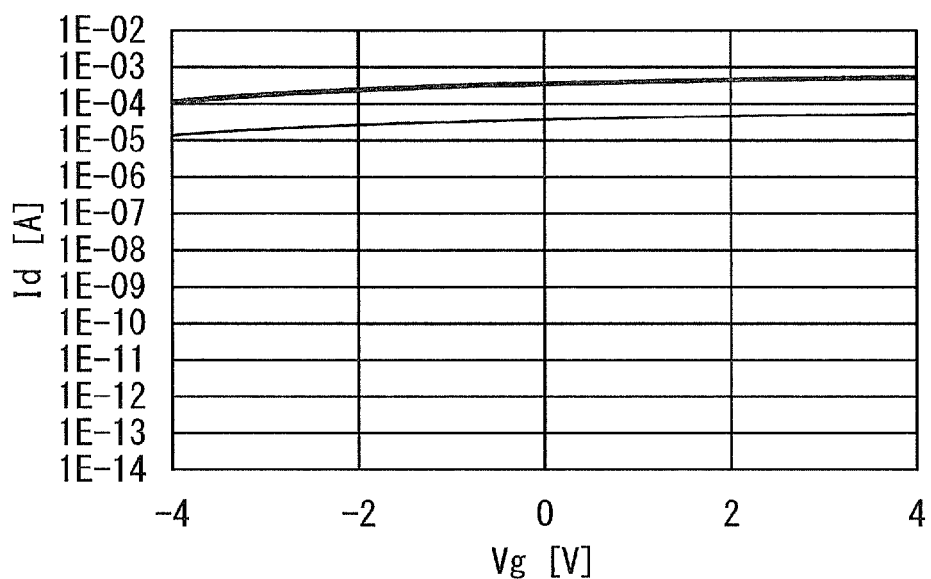

FIG. 3B shows the following electrical characteristics of Comparative example transistor 2: gate voltage versus drain current (Vg-Id) characteristics (denoted by a medium thin line in FIG. 3B) in the case where the drain voltage (Vd) is 1 V; gate voltage versus drain current (Vg-Id) characteristics (denoted by a medium thin line in FIG. 3B) in the case where the drain voltage (Vd) is 0.1 V.

As shown in FIGS. 2A and 2B, Example transistor 1 and Example transistor 2 exhibited electrical characteristics as switching elements. In the case where the drain voltage (Vd) was 1 V, Example transistor 1 and Example transistor 2 had shift values from 0 V as small as −0.79 V and −0.80 V, respectively. In the case where the drain voltage (Vd) was 0.1 V, Example transistor 1 and Example transistor 2 had field-effect mobilities of 2.6 cm$^2$/Vs and 4 cm$^2$/Vs, respectively.

On the other hand, Comparative example transistor 1 and Comparative example transistor 2 did not exhibit electrical characteristics as switching elements, as shown in FIGS. 3A and 3B.

From the above evaluations, it was able to confirm that the transistors of this example exhibit sufficient electrical characteristics as switching elements even when the transistors have minute structures in which the channel lengths are 0.25 μm and 0.45 μm.

This application is based on Japanese Patent Application serial no. 2011-195231 filed with Japan Patent Office on Sep. 7, 2011, the entire contents of which are hereby incorporated by reference.

What is claimed is:

1. A method for manufacturing a semiconductor device, comprising the steps of:
    performing polishing treatment on a surface of an oxide insulating layer;
    forming an oxide semiconductor film over the oxide insulating layer after the polishing treatment;
    introducing oxygen into the oxide semiconductor film after forming the oxide semiconductor film;
    forming a gate insulating film over the oxide semiconductor film;
    forming a gate electrode layer over the gate insulating film, wherein the gate electrode layer overlaps with the oxide semiconductor film;
    selectively introducing a dopant to the oxide semiconductor film using the gate electrode layer as a mask; and
    forming an insulating layer over the oxide semiconductor film and the gate electrode layer, wherein the insulating layer comprises an aluminum oxide film.

2. The method for manufacturing a semiconductor device according to claim 1, wherein an average surface roughness of the oxide insulating layer is less than or equal to 0.15 nm.

3. The method for manufacturing a semiconductor device according to claim 1, wherein the oxide semiconductor film comprises indium, gallium, zinc, and oxygen, and an atomic percentage of the indium is twice or more as large as each of an atomic percentage of the gallium and an atomic percentage of the zinc.

4. The method for manufacturing a semiconductor device according to claim 1, wherein the insulating layer has a stacked layer structure.

5. The method for manufacturing a semiconductor device according to claim 1, wherein the insulating layer has a stacked layer structure comprising the aluminum oxide film and a silicon oxide film over the aluminum oxide film.

6. The method for manufacturing a semiconductor device according to claim 1, wherein a concentration of oxygen in the oxide semiconductor film is greater than or equal to $1\times10^{18}$/cm$^3$ and less than or equal to $3\times10^{21}$/cm$^3$.

7. A method for manufacturing a semiconductor device, comprising the steps of:
    performing polishing treatment on a surface of an oxide insulating layer;
    forming an oxide semiconductor film over the oxide insulating layer after the polishing treatment;
    introducing oxygen into the oxide semiconductor film after forming the oxide semiconductor film;
    processing the oxide semiconductor film to be an island-shaped oxide semiconductor film;
    forming a gate insulating film over the island-shaped oxide semiconductor film;
    forming a gate electrode layer over the gate insulating film, wherein the gate electrode layer overlaps with the island-shaped oxide semiconductor film;
    selectively introducing a dopant to the island-shaped oxide semiconductor film using the gate electrode layer as a mask; and
    forming an insulating layer over the island-shaped oxide semiconductor film and the gate electrode layer, wherein the insulating layer comprises an aluminum oxide film.

8. The method for manufacturing a semiconductor device according to claim 7, wherein an average surface roughness of the oxide insulating layer is less than or equal to 0.15 nm.

9. The method for manufacturing a semiconductor device according to claim 7, wherein the oxide semiconductor film comprises indium, gallium, zinc, and oxygen, and an atomic percentage of the indium is twice or more as large as each of an atomic percentage of the gallium and an atomic percentage of the zinc.

10. The method for manufacturing a semiconductor device according to claim 7, wherein the insulating layer has a stacked layer structure.

11. The method for manufacturing a semiconductor device according to claim 7, wherein the insulating layer has a stacked layer structure comprising the aluminum oxide film and a silicon oxide film over the aluminum oxide film.

12. The method for manufacturing a semiconductor device according to claim 7, wherein a concentration of oxygen in the oxide semiconductor film is greater than or equal to $1\times10^{18}/cm^3$ and less than or equal to $3\times10^{21}/cm^3$.

13. The method for manufacturing a semiconductor device according to claim 1, wherein the oxide semiconductor film is formed by a sputtering method using an oxide target having a composition of indium:gallium:zinc=3:1:2.

14. The method for manufacturing a semiconductor device according to claim 7, wherein the oxide semiconductor film is formed by a sputtering method using an oxide target having a composition of indium:gallium:zinc=3:1:2.

* * * * *